United States Patent
Asakawa et al.

(10) Patent No.: US 9,268,328 B2
(45) Date of Patent: Feb. 23, 2016

(54) PRODUCTION EFFICIENCY IMPROVING APPARATUS, PRODUCTION EFFICIENCY IMPROVING METHOD, AND COMPUTER PROGRAM

(75) Inventors: Teruo Asakawa, Tokyo (JP); Makoto Yamamoto, Kyoto (JP); Akira Machida, Aizuwakamatsu (JP); Masaaki Kawaguchi, Osaka (JP)

(73) Assignees: TOKYO ELECTRON LIMITED, Tokyo (JP); MURATA MACHINERY, LTD., Kyoto (JP); MA SOLUTIONS LIMITED, Fukushima (JP); DAIFUKU CO., LTD., Osaka (JP)

( * ) Notice: Subject to any disclaimer, the term of this patent is extended or adjusted under 35 U.S.C. 154(b) by 234 days.

(21) Appl. No.: 14/004,120

(22) PCT Filed: Mar. 9, 2012

(86) PCT No.: PCT/JP2012/056144
§ 371 (c)(1),
(2), (4) Date: Sep. 25, 2013

(87) PCT Pub. No.: WO2012/121378
PCT Pub. Date: Sep. 13, 2012

(65) Prior Publication Data
US 2014/0018955 A1    Jan. 16, 2014

(30) Foreign Application Priority Data
Mar. 10, 2011    (JP) .................................. 2011-053590

(51) Int. Cl.
*G06F 7/00*     (2006.01)
*G06F 19/00*    (2011.01)
(Continued)

(52) U.S. Cl.
CPC ...... *G05B 19/4189* (2013.01); *G05B 19/41865* (2013.01); *H01L 21/67276* (2013.01)

(58) Field of Classification Search
None
See application file for complete search history.

(56) References Cited

FOREIGN PATENT DOCUMENTS

| JP | 2004-134778 A | 4/2004 |
|----|---------------|--------|
| JP | 2005-208891 A | 8/2005 |

(Continued)

OTHER PUBLICATIONS

Yamamoto Makoto, "Next Generation Conveyance System," SEMI News 2006, vol. 22, No. 6 and an English translation thereof (8 pages).

(Continued)

*Primary Examiner* — Yolanda Cumbess
(74) *Attorney, Agent, or Firm* — Rothwell, Figg, Ernst & Manbeck, P.C.

(57) ABSTRACT

A production efficiency improving apparatus includes a first communicating means for communicating information with a plurality of processing apparatuses that process objects, and a second communicating means for communicating conveyance control information, with a conveyance system comprising conveyance apparatuses for conveying the objects between the plurality of processing apparatuses. A means for predicting, on the basis of information communicated by the first communicating means, the conveying timing at which the processing apparatus needs to send out processed objects, and the conveying timing at which the processing apparatus needs to bring in unprocessed objects. A generating means generates the control information such that the conveyance apparatus will arrive at the processing apparatus that is the destination of the communication of information at the predicted timing predicted by the means for predicting.

20 Claims, 17 Drawing Sheets

(51) Int. Cl.
*G05B 19/418* (2006.01)
*H01L 21/67* (2006.01)

(56) References Cited

FOREIGN PATENT DOCUMENTS

| JP | 2008-310467 A | 12/2008 |
| JP | 2009-76495 A | 4/2009 |
| JP | 2009-135275 A | 6/2009 |
| JP | 2009135275 A * | 6/2009 |

OTHER PUBLICATIONS

International Search Report mailed May 1, 2012 in PCT/JP2012/056144.

* cited by examiner

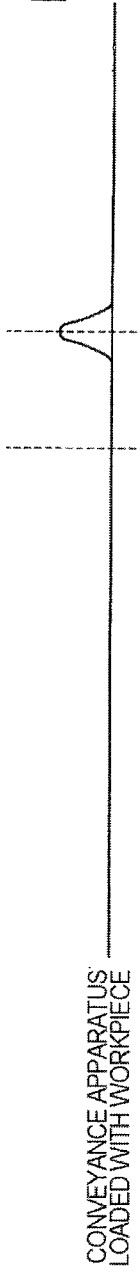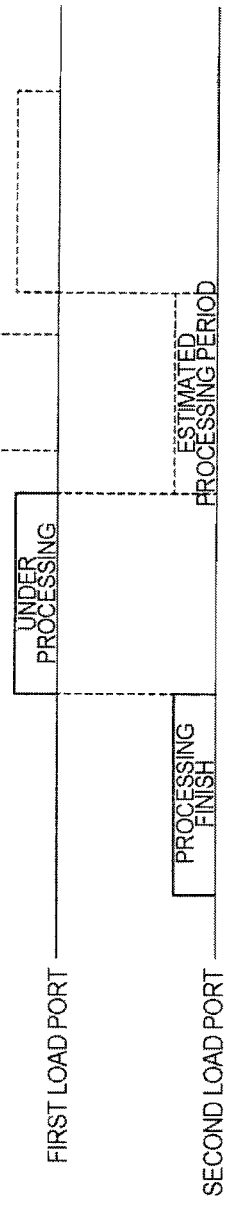

US 9,268,328 B2

PRODUCTION EFFICIENCY IMPROVING APPARATUS, PRODUCTION EFFICIENCY IMPROVING METHOD, AND COMPUTER PROGRAM

CROSS REFERENCE TO RELATED APPLICATIONS

This application is a 35 U.S.C. 371 National Phase Entry Application from PCT/JP2012/056144, filed Mar. 9, 2012, which claims the benefit of Japanese Patent Application No. 2011-053590, filed Mar. 10, 2011, the disclosures of which are incorporated herein in their entirety by reference.

TECHNICAL FIELD

The present disclosure relates to a production efficiency improving apparatus and a production efficiency improving method which improve the efficiency of the conveyance and processing of workpieces to be processed in a production processing system in which the workpieces are conveyed between a plurality of processing apparatuses and processed, and a computer program configured to operate a computer as the production efficiency improving apparatus.

BACKGROUND

A production processing system has been put into a practical use and the production processing system includes: a plurality of processing apparatuses configured to process workpieces; a plurality of conveyance apparatuses configured to convey the workpieces between the plurality of processing apparatuses; a conveyance control unit configured to control the operation of the plurality of conveyance apparatuses; and a production execution control apparatus configured to determine a processing apparatus in which a workpiece should be processed, instruct a recovery destination and a conveyance destination of the workpieces to the conveyance control apparatus and instruct processing contents for the workpieces to the processing apparatuses.

Patent Document 1 discloses a software which includes at least one of: a sequence of communicating with a plurality of processing apparatuses configured to process workpieces; a sequence of communicating with a plurality of conveyance apparatuses configured to convey the workpieces from an arbitrary processing apparatus to another arbitrary processing apparatus among the processing apparatuses; a sequence of communicating with a production instruction apparatus configured to instruct a processing for the workpiece; a conveyance instruction sequence of instructing the movement of the conveyance apparatuses to the conveyance apparatuses using information obtained by communication; and a processing instruction sequence of instructing a processing to be executed to the processing apparatuses using the information.

Also, in Non-Patent Document 1, it is disclosed that the efficiency of conveyance may be improved when a factory production management system (Manufacturing Execute System ("MES")) and a conveyance control system (Material Control System ("MCS")) configured to control a conveyance system (Overhead Hoist Transfer ("OHT")) by receiving various instructions from the MES share information such as, for example, a factory layout. It is also disclosed that, when buffers capable of moving and loading workpieces directly from a carriage of the OHT, for example, overhead buffers ("OHBs") (racks under an OHT rail), are provided and a group of apparatuses of the next process are known in advance, the workpieces may be conveyed to a designated apparatus within a short time by carrying the workpieces to the buffer of the corresponding bay in advance without using a stocker.

PRIOR ART DOCUMENT

Patent Document

Patent Document 1: Japanese Patent Laid-Open Publication No. 2009-135275
Patent Document 2: Japanese Patent Laid-Open Publication No. 2008-310467
Patent Document 3: Japanese Patent Laid-Open Publication No. 2004-134778

Non-Patent Document

Non-Patent Document 1: Yamamoto Makoto, "Next Generation Conveyance System", SEMI News 2006, Vol. 22, No. 6

DISCLOSURE OF THE INVENTION

Problems to be Solved

In the conventional system of the related art, when a processing for a workpiece has been completed in a processing apparatus, the processing apparatus reports to the MES that the processing for the workpiece has been completed. Upon receiving the report, the MES instructs the recovery and delivery of the workpiece to a conveyance control apparatus. Subsequently, when the processed workpiece is recovered, the processing apparatus reports to the MES that a load port of the processing apparatus is empty and thus, the processing apparatus is in a state where it may receive a workpiece to be processed next. Upon receiving the report, the MES designates a workpiece to be processed next in the processing apparatus and instructs the delivery of the workpiece to the processing apparatus to the conveyance control apparatus. In the system configured in this way, it takes a long time for a workpiece to be recovered by a conveyance apparatus after the processing for the workpiece in a processing apparatus is finished. Also, it takes a long time for a workpiece to be processed next to arrive at the processing apparatus. Thus, there is a concern in that, for example, a situation in which a workpiece to be processed next does not exist in a processing apparatus may occur, and thus, production efficiency in the factory may deteriorate. In addition, when a plurality of apparatuses that have finished the processings for workpieces exist in some regions of the factory, there is a concern in that, for example, a situation in which conveyance apparatuses are congested on the conveyance path in the vicinity of the processing apparatuses so that it may take a long time to convey may occur, the production efficiency in the factory may deteriorate.

The present disclosure has been made in consideration of such situations and an object of the present disclosure is to improve the production efficiency by estimating a workpiece processing finish time in processing apparatuses and speculatively moving conveyance apparatuses.

Means to Solve the Problems

A production efficiency improving apparatus includes: a first communication unit configured to communicate information with a plurality of processing apparatuses each of which is configured to process a workpiece; a second communication unit configured to communicate control information regarding a control of a conveyance apparatus configured to convey workpieces to the plurality of processing apparatuses with a conveyance system including the conveyance apparatus; a conveyance timing estimation unit configured to estimate, based on the information communicated by the first communication unit, a conveyance timing when a processing apparatus with which the first communication unit communicates the information requires the conveyance of a workpiece; and a generation unit configured to generate control information for the conveyance system such that the conveyance apparatus arrives at the processing apparatus with which the first communication unit communicates the information at the conveyance timing estimated by the conveyance timing estimation unit.

In the production efficiency improving apparatus of the present disclosure, the control information includes an instruction to move a conveyance apparatus which is not loaded with a workpiece to a processing apparatus with which the first communication unit communicates the information.

In the production efficiency improving apparatus of the present disclosure, the control information includes an instruction to move a conveyance apparatus which is loaded with a workpiece to the processing apparatus with which the first communication unit communicates the information.

In the production efficiency improving apparatus of the present disclosure, the conveyance system includes a plurality of conveyance apparatuses, and the control information includes an instruction to move the conveyance apparatuses such that more conveyance apparatuses are distributed in a region where a large number of processing apparatuses which finish the processing for workpieces during a predetermined period are present rather than in a region where a small number of processing apparatuses which finish the processing for workpieces during the period are present.

In the production efficiency improving apparatus of the present disclosure, the generation unit is configured to generate control information which includes: an instruction to make the conveyance apparatus stand by when the conveyance apparatus arrive at the processing apparatus before the processing of the workpiece is finished in the processing apparatuses, an instruction to make the conveyance apparatus tour around the processing apparatus, or an instruction to move the conveyance apparatus to a predetermined position.

In the production efficiency improving apparatus of the present disclosure, the control information includes an instruction to move each of the conveyance apparatuses such that a conveyance apparatus which is not loaded with a workpiece and a conveyance apparatus which is loaded with a workpiece to be processed in the processing apparatus arrive at the processing apparatus in this order.

The production efficiency improving apparatus includes: a unit configured to directly or indirectly communicate production execution control information sent from a production execution control apparatus configured to control an operation of the processing apparatuses and the conveyance apparatuses. The contents of the production execution control information sent from the production execution control apparatus and the contents of the control information generated by the generation unit are adapted not to contradict each other.

The production efficiency improving apparatus includes: a unit configured to predict a required movement time which is a time needed for the conveyance apparatus to arrive at the processing apparatus with which the first communication unit communicates the information. The control information includes a movement start timing at which the movement of the conveyance apparatus is started and the movement start timing is ahead of the conveyance timing by the required movement time.

In the production efficiency improving apparatus of the present disclosure, the conveyance timing includes a timing at which the processing in the processing apparatus is finished and the workpiece may be taken out by the conveyance apparatus, a timing at which a non-processed workpiece to be processed in the processing apparatus does not exist, or a timing between the timings.

In the production efficiency improving apparatus of the present disclosure, each of the processing apparatuses is configured to communicate information regarding a remaining processing time of a workpiece which is put into the processing apparatus and information regarding a time during which a next workpiece is needed to continue the processing subsequently. The production efficiency improving apparatus includes: a unit configured to calculate, based on the information communicated with the plurality of processing apparatuses, a finish timing when the processing of the workpiece put into each of the processing apparatuses is finished and a start timing when each of the processing apparatuses needs a next workpiece based; and a unit configured to determine the priority to move the conveyance apparatuses based on the calculated finish timing and start timing.

The production efficiency improving apparatus includes: a unit configured to communicate an actually consumed result time required for processing a workpiece in each of the processing apparatuses or an actual finish time when the processing has been actually finished; and a unit configured to correlate and accumulate the estimated finish timing, the actually consumed result time or the actual finish time, and the information used to estimate the estimated finish timing. The generation unit is configured to generate the control information using the accumulated information.

In the production efficiency improving apparatus of the present disclosure, the information communicated by the first communication unit includes information representing that the processing of a workpiece is in a specific processing process.

In the production efficiency improving apparatus of the present disclosure, wherein the information communicated by the first communication unit includes information representing a time required for processing of a workpiece in each of the processing apparatuses or a predetermined timing when the processing is finished.

In the production efficiency improving apparatus of the present disclosure, the information communicated by the first communication unit includes information represented by each of the processing apparatus that the processing apparatus is in a specific state.

In the production efficiency improving apparatus of the present disclosure, the information communicated by the first communication unit includes information regarding an actually consumed time required for a past processing in the processing apparatus or the actual time when the processing has been finished in the processing apparatus.

In the production efficiency improving apparatus of the present disclosure, the first communication unit is configured to receive information sent when the processing of a workpiece is being processed in a specific processing process.

The production efficiency improving apparatus includes: a unit configured to request, from each of the processing apparatuses, information required for estimating a conveyance timing when the processing apparatus requires the conveyance of a workpiece. The first communication unit configured to receive information sent from the processing apparatuses according to the request.

The production efficiency improving apparatus includes: a unit configured to request, from each of the processing apparatuses, setting of a timing of sending information required for estimating a conveyance timing when the processing apparatus requires the conveyance of a workpiece.

A production efficiency improving method includes: communicating information with a plurality of processing apparatuses each of which is configured to process a workpiece; communicating control information regarding a control of a conveyance apparatus configured to convey workpieces to the plurality of processing apparatuses with a conveyance system including the conveyance apparatus; estimating a carry-out time when a processing apparatus with which a first communication unit communicates the information requires a carry-out of a workpiece processed by the processing apparatus or a carry-in time when the processing apparatus requires a carry-in of a workpiece; and generating control information for the conveyance apparatus such that the conveyance apparatus arrives at the processing apparatus with which the first communication unit communicates the information at a timing corresponding to the estimated carry-out time and carry-in time.

A computer program which enables a computer to serve as: a first communication unit that communicates information with a plurality of processing apparatuses each of which is configured to process a workpiece; a second communication unit that communicates control information regarding a control of a conveyance apparatus configured to convey workpieces to the plurality of processing apparatuses with a conveyance system including the conveyance apparatus; a unit that estimates, based on the information communicated by the first communication unit, a carry-out time period when a processing apparatus with which the first communication unit communicates the information requires need a carry-out of the workpiece processed by the processing apparatus or a carry-in time when the processing apparatus requires a carry-in of a workpiece; and a unit that generates control information for the conveyance apparatus such that the conveyance apparatus arrives at the processing apparatus with which the first communication unit communicates the information at a timing corresponding to the estimated carry-out time and carry-in time.

In the present disclosure, information sent from processing apparatuses is received and the received information is used to estimate a conveyance timing when the processing apparatuses require the conveyance of workpieces. Also, control information of moving conveyance apparatuses to the processing apparatuses is generated. The generated information is sent to the conveyance system. The movement of the conveyance apparatuses starts according to the estimated conveyance timing. Therefore, it is possible to start a preliminary action such as, for example, recovery of workpieces without waiting for the processing finish of workpieces and conveyance of workpieces to be processed next.

In the present disclosure, conveyance apparatuses which are not loaded with workpieces are moved to processing apparatuses. The conveyance apparatuses recover processed workpieces from the processing apparatuses.

In the present disclosure, conveyance apparatuses loaded with workpieces are moved to processing apparatuses. That is, the conveyance apparatuses loaded with workpieces to be processed next in the processing apparatuses are moved to the processing apparatuses. The processing apparatuses process the workpieces conveyed by the conveyance apparatuses.

In the present disclosure, more conveyance apparatuses are distributed in a region where a large number of processing apparatuses finish processings within a predetermined period. Therefore, it is possible to efficiently convey workpieces to the processing apparatuses.

In the present disclosure, when the conveyance apparatuses arrive at the processing apparatuses before the processing of the workpiece is finished in the processing apparatuses, the conveyance apparatus stands by. Also, the conveyance apparatus may make a tour in the periphery of the processing apparatuses. Or, the conveyance apparatuses may be moved to a predetermined location such as, for example, a garage. Therefore, it is possible to avoid congestion of the conveyance apparatuses, efficiently recover the processed workpiece from the processing apparatuses, and convey the workpiece which is needed next to the processing apparatuses.

In the present disclosure, conveyance apparatuses which are not loaded with workpieces are moved to processing apparatuses and recover processed workpieces from the processing apparatuses. Then, conveyance apparatuses loaded with workpieces to be processed next are moved to the processing apparatus and the workpieces are processed in the processing apparatuses.

In the present disclosure, production execution control information sent from the production execution control apparatuses is directly or indirectly received. The production execution control apparatus definitively controls the operation of the processing apparatuses and the conveyance system. Meanwhile, the production efficiency improving apparatus speculatively controls the operation of the conveyance apparatuses in a step before the contents of control for the conveyance apparatuses and the processing apparatuses become definitive in order to improve efficiency in conveying and processing workpieces. The production efficiency improving apparatus matches the control information generated by itself with the production execution control information sent from the production execution control apparatus such that they do not contradict each other. Therefore, the control information generated by the production efficiency improving apparatus does not cause a trouble in operation such as, for example, a malfunction of the conveyance system.

In the present disclosure, a time required for movement of a conveyance apparatus for arriving at a processing apparatus at an estimated conveyance timing is estimated. A timing which is ahead of the conveyance timing by the time required for movement is set as a movement start timing. The control information includes information regarding the movement start timing.

In the present disclosure, the conveyance timing includes a timing which the processing in the processing apparatus is finished so that a workpiece may be taken out by the conveyance apparatus, a timing when an unprocessed workpiece to be processed in the processing apparatus does not exist or a timing between respective timings.

In the present disclosure, each processing apparatus communicates information regarding a remaining time for processing workpieces loaded therein and information regarding calculation of a time which the processing apparatus requires workpieces to continue a processing consecutively. Also, based on the information communicated with a plurality of processing apparatuses, the finish time when the processing of workpieces loaded in each of the processing apparatuses is finished and the start time when each of the processing apparatuses requires the next workpieces and based on the calculated finish time and start time, the priority of the processing apparatuses to which the conveyance apparatuses are moved is determined.

In the present disclosure, an estimated processing time, an actually consumed time required for actually processing workpieces in the processing apparatuses, or the actual finish time when a processing is actually finished, the information used to estimate the estimated finish time are correlated with each other and accumulated and the conveyance timing is estimated using the accumulated information. Accordingly, the precision of conveyance timing may be enhanced.

In the present disclosure, each processing apparatus sends information representing that a processing for a workpiece is in a specific processing process. The production efficiency improving apparatus receives the information sent from the processing apparatus and estimates a conveyance timing using the information.

In the present disclosure, each processing apparatus sends information representing a predetermined time when a processing for workpieces is finished in the processing apparatus. The production efficiency improving apparatus receives the information sent from the processing apparatus and estimates the conveyance timing using the information.

In the present disclosure, each processing apparatus sends information representing that the processing apparatus is in a specific state other than a processing of workpieces. The production efficiency improving apparatus receives the information sent from the processing apparatus and estimates the conveyance timing using the information.

In the present disclosure, each processing apparatus sends information regarding an actually consumed time at a past processing finish time and the production efficiency improving apparatus estimates a processing finish using the information.

In the present disclosure, each processing apparatus sends information used to estimate the conveyance timing when a processing of workpieces enters into a specific processing process in the processing apparatus.

In the present disclosure, the production efficiency improving apparatus requests from the processing apparatus information required for estimating a conveyance time and the processing apparatuses send the information to the production efficiency improving apparatus according to the request.

In the present disclosure, the production efficiency improving apparatus sets a timing for sending information required for estimating the conveyance timing in the processing apparatuses. The processing apparatuses send the information to the production efficiency improving apparatus at the set timing.

Effect of the Invention

According to the present disclosure, production efficiency may be improved by estimating a workpiece processing finish time in processing apparatuses and speculatively moving conveyance apparatuses.

BRIEF DESCRIPTION OF THE DRAWINGS

FIGS. 14A to 14D are timing charts illustrating an arrival timing of empty processing apparatuses and processing apparatuses loaded with workpieces according to a modified example 2.

DETAILED DESCRIPTION TO EXECUTE THE INVENTION

Hereinafter, the present disclosure will be described in detail with reference to drawings illustrating an exemplary embodiment.

Figure 1:
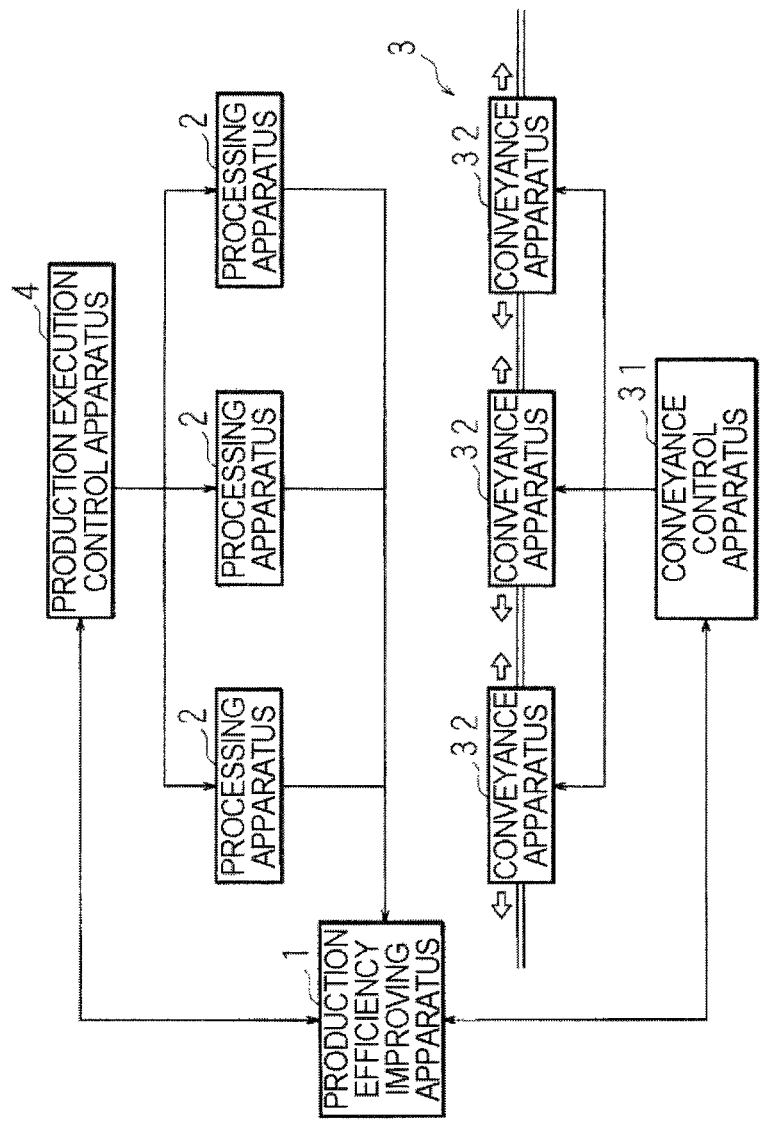
FIG. 1 is a block diagram illustrating a configuration example of a production processing system including a production efficiency improving apparatus according to an exemplary embodiment.

FIG. 1 is a block diagram illustrating a configuration example of a production processing system including a production efficiency improving apparatus according to the present exemplary embodiment. The production processing system according to the exemplary embodiment of the present disclosure includes a plurality of processing apparatuses 2, a conveyance system 3 including a plurality of conveyance apparatuses 32 and a conveyance control apparatus 31 configured to control the conveyance apparatuses 32, a production execution control apparatus 4 configured to grant a control instruction to the processing apparatuses 2 and the conveyance system 3 to control the operation of each apparatus, and a production efficiency improving apparatus 1 configured to conduct communication with the plurality of processing apparatuses 2 and the conveyance system 3.

The production execution control apparatus 4 is a computer which includes a scheduler module that constitutes a so-called MES and prepares a production plan according to, for example, the kind and specification of products to be manufactured and a dispatcher module that specifies processing apparatuses 2 where workpieces are processed according to the prepared production plan and performs a processing of instructing each of the processing apparatuses 2 and the conveyance system 3 of a processing content and a conveyance control content for a workpiece. Hereinafter, information sent to each of the processing apparatuses 2 and the conveyance system 3 from the production execution control apparatus 4 to control the operations of the processing apparatuses 2 and the conveyance system 3 is referred to as production execution control information.

The processing apparatuses 2 are, for example, substrate processing devices such as, for example, a plasma CVD device, a plasma etching device, and a sputtering device configured to process a workpiece such as, for example, a glass substrate for manufacturing an organic EL device and a silicon wafer for manufacturing, for example, a semiconductor device. Also, the processing apparatuses 2 have a function to send information for estimating a processing finish time to the production efficiency improving apparatus 1 before a processing for a workpiece is finished. Further, in the present exemplary embodiment, an example in which various lengths of time related to a conveyance control are processed using time is described. However, the lengths of time may be processed using a length of time with reference to an arbitrary time point. Furthermore, the processing apparatuses 2 have a function to send processing finish information representing that a processing for a workpiece is finished to the production execution control apparatus 4.

Figure 2:
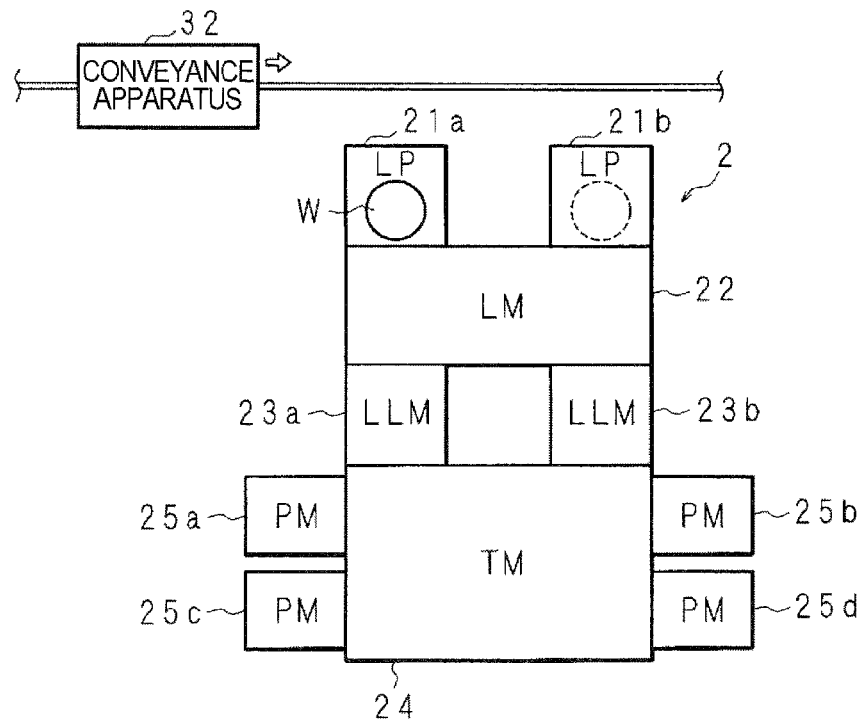
FIG. 2 is a block diagram illustrating a configuration example of a processing apparatus.

FIG. 2 is a block diagram illustrating a configuration example of a processing apparatus 2. The processing apparatus 2 is, for example, a multi-chamber type substrate processing system. The processing apparatus 2 includes a load module 22 which is provided with first and second load ports (LPs) 21a, 1b. A front open unified pod ("FOUP") configured to accommodate workpieces W is disposed on each of the first and second LPs 21a, 21b to deliver the FOUPs. The load module 22 is connected to a transfer module (TM) 24 via load lock modules 23a, 23b. A vacuum robot provided in the transfer module 24 conveys workpieces W carried into the transfer module 24 to process modules, 25a, 25b, 25c, 25d through the load lock modules 23a, 23b. The process modules 25a, 25b, 25c, 25d perform a predetermined processing on the workpieces W according to a recipe. The processed workpieces W are a recovered to the FOUPs disposed on the first and the second load ports 21a, 21b in the opposite path and carried out from the load ports 21a, 21b by the FOUP.

The conveyance apparatuses 32 are, for example, conveyance shuttles configured to travel a track provided on, for example, the ceiling or the bottom or unmanned conveyance vehicles configured to travel a predetermined route and serve to convey the FOUPs. The conveyance apparatuses 32 move between the plurality of processing apparatuses 2 and a stocker which is stocked with FOUPs and convey the workpieces accommodated in the FOUPs according to an instruction given from the conveyance control apparatus 31.

The conveyance control apparatus 31 is a computer which constitutes a so-called MCS and controls the operation of the conveyance apparatuses 32 according to one or both of the production execution control information given from the production execution control apparatus 4 and the control information given from the production efficiency improving apparatus 1 to be described later.

Figure 3:
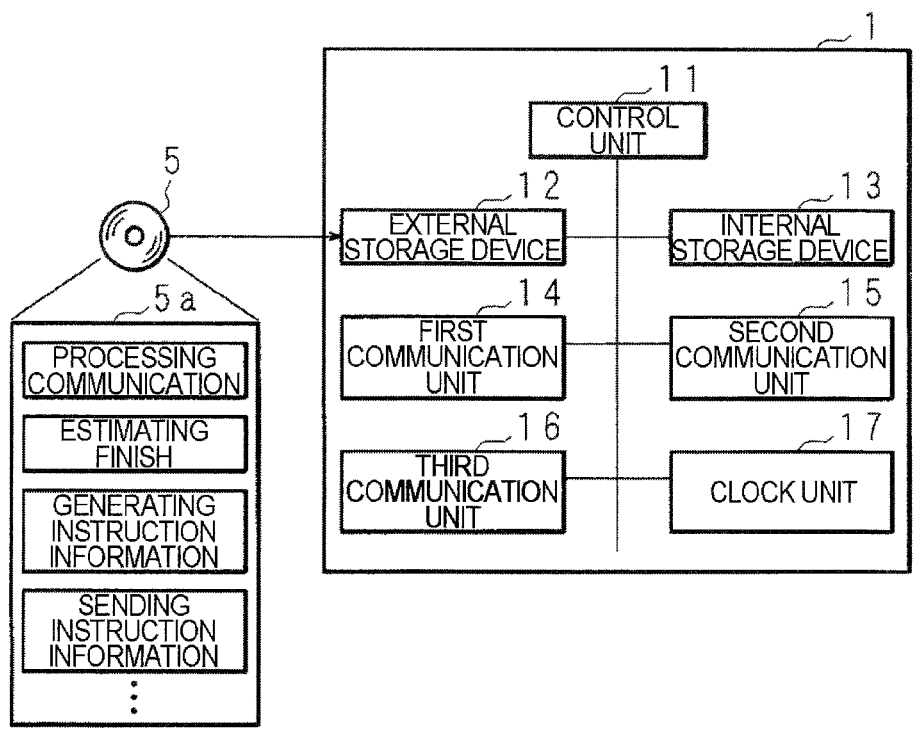
FIG. 3 is a block diagram illustrating a configuration example of the production efficiency improving apparatus according to the present exemplary embodiment.

FIG. 3 is a block diagram illustrating a configuration example of the production efficiency improving apparatus 1 according to the present exemplary embodiment. The production efficiency improving apparatus 1 is a computer having functions such as, for example, a function of communicating information with the processing apparatuses 2 and estimating the time when a processing for workpieces is finished in the processing apparatuses 2 which are the origins of transmission of the information (hereinafter, the time will be referred to as processing finish time) based on the information obtained by the communication, a function of setting and instructing the contents of the information from the processing apparatuses 2 and the communication timing to the processing apparatuses 2, and a function of generating instruction information which makes the conveyance apparatuses 32 start movement such that the conveyance apparatuses 32 arrive at the processing apparatuses 2 which are the origins of transmission of the information at the timing corresponding to the estimated processing finish time. The instruction information is included in the control information regarding the control of the conveyance apparatuses 32.

Specifically, the production efficiency improving apparatus 1 is a computer provided with a control unit 11 configured to control the operation of each configuration component of the production efficiency improving apparatus 1, for example, a CPU (Central Processing Unit). The control unit 11 is connected with an internal storage device 13 such as, for example, a ROM or RAM connected thereto through a bus, an external storage device 12 such as, for example, a hard disk drive, a solid state drive, and a CD-ROM drive which are capable of reading data from a portable storage medium, first to third communication units 14, 15, 16, and a clock unit 17.

The ROM is a non-volatile memory such as, for example, a mask ROM or an EEPROM in which a control program required for the operation of a computer is stored.

The RAM is a volatile memory such as, for example, a DRAM or an SRAM which temporarily stores various data generated when an arithmetic operation processing of the control unit 11 is performed and a control program required for the operation of a computer.

Each of the first to the third communication units 14, 15, 16 is an interface to send/receive the information between the processing apparatus 2, the conveyance control apparatus 31 and the production execution control apparatus 4. The transmission/reception of various information items by the first to the third communication units 14, 15, 16 is controlled by the control unit 11.

A computer program 5a is recorded on a record medium 5 which is a computer-readable and portable medium such as, for example, a CD (Compact Disc) ROM, a DVD (Digital Versatile Disc) ROM, or a BD (Blue-ray Disc), a hard disc drive, or a solid state drive. The control unit 11 reads out the program 5a from, for example, the portable medium or the hard disc drive which are recorded with the computer program 5a and stores the computer program 5a in the internal storage device 13. Also, needless to say, an optical disc and an optical disc drive are examples of the record medium 5 and the computer program 5a may be configured such that it is recorded on, for example, a flexible disc, a magneto-optical disc, an external hard disc, and a semiconductor memory to be computer-readable and read out by the external storage device 12. Also, the computer program 5a according to the present disclosure may be downloaded from an external computer (not illustrated) which is connected to a communication network.

Figure 4:
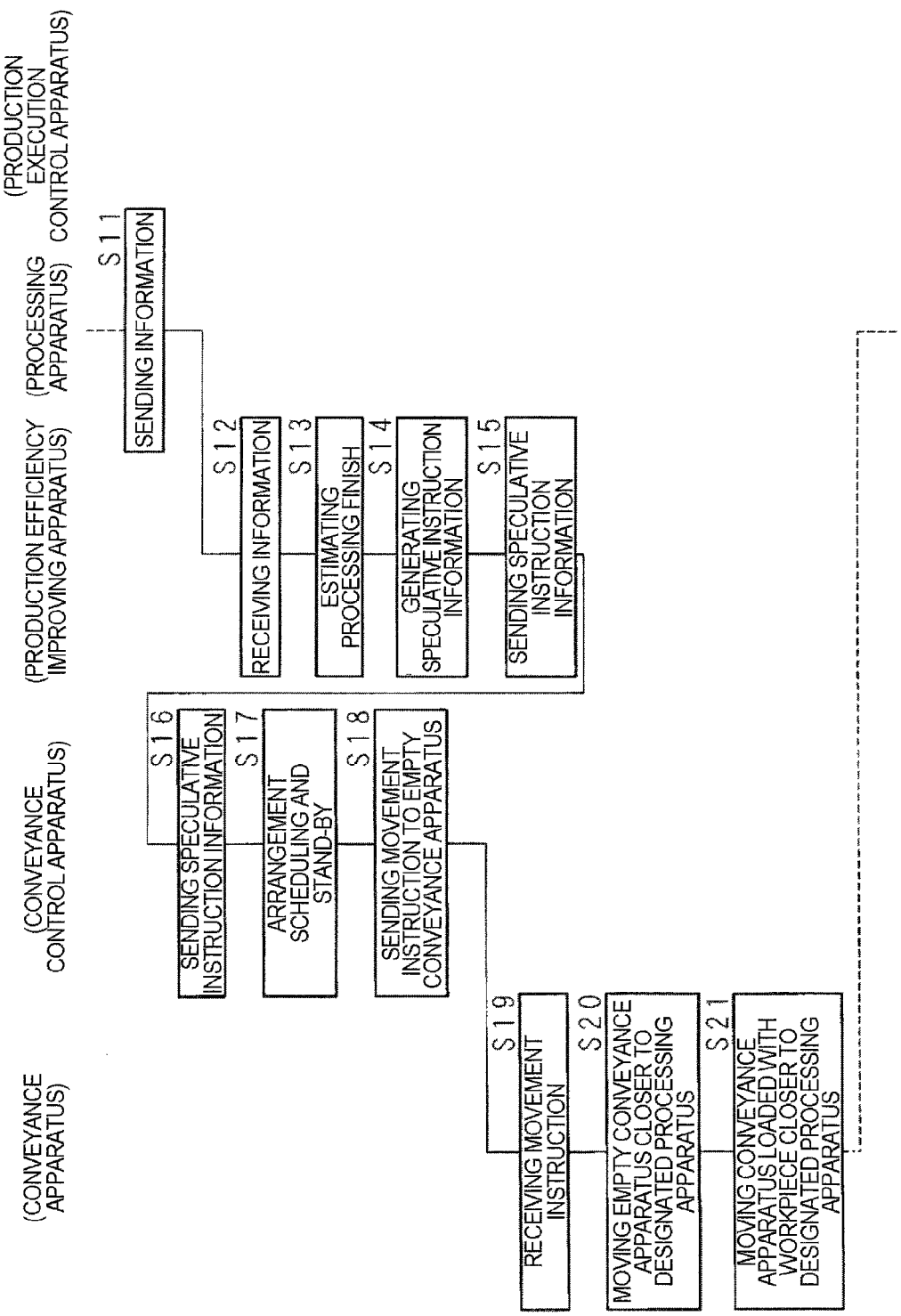
FIG. 4 is a flowchart illustrating a processing sequence of the production efficiency improving apparatus.
Figure 5:
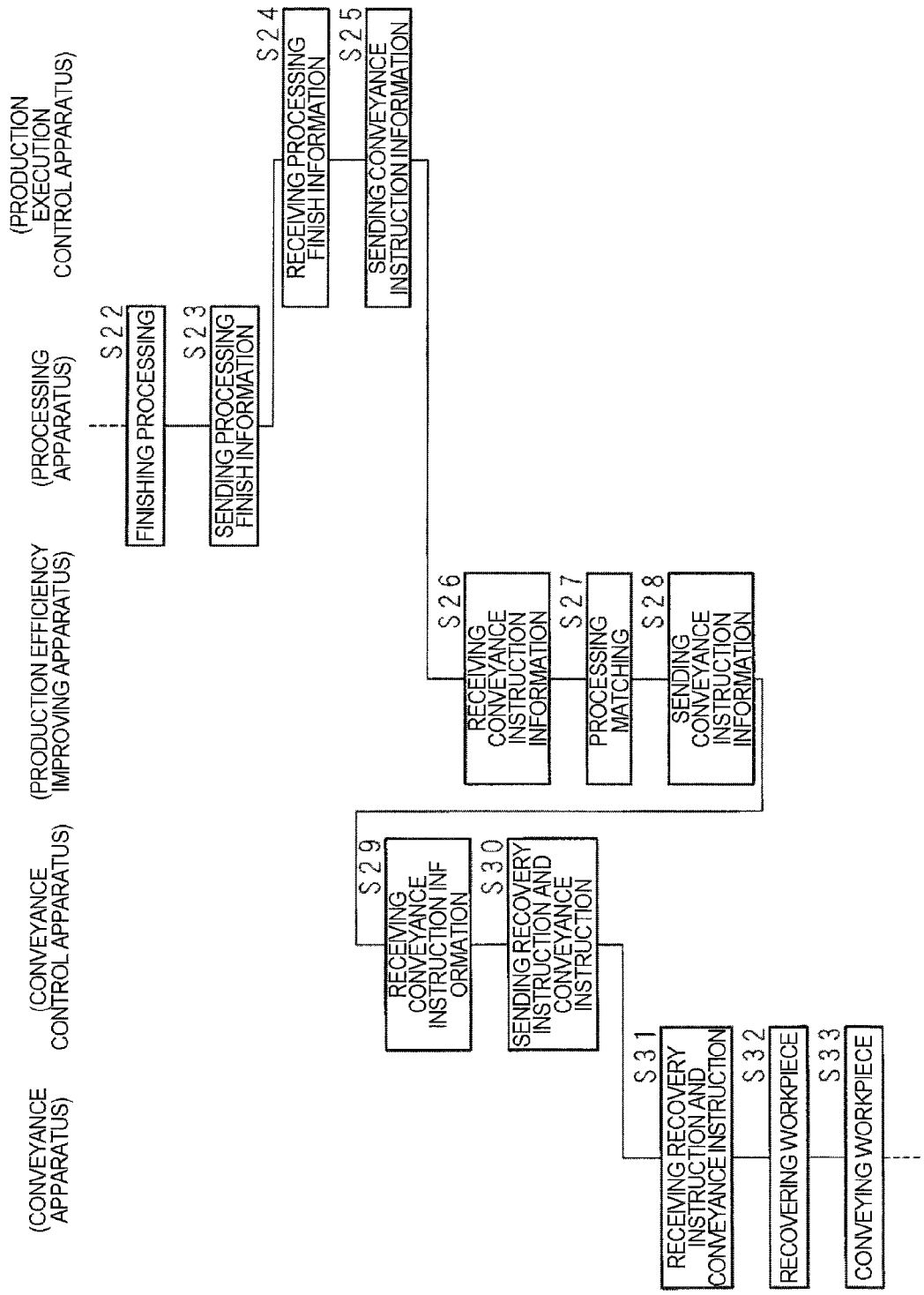
FIG. 5 is a flowchart illustrating the processing sequence of the production efficiency improving apparatus.

FIGS. 4 and 5 are flowcharts illustrating processing sequences of the production efficiency improving apparatus 1.

<Basic Flow of Production Efficiency Improvement>

A processing apparatus 2 which is performing a processing for a workpiece sends information required for estimating the time when the processing for the workpiece is finished to the production efficiency improving apparatus 1 (step S11).

(Information 1: Information for Notifying Passing of Specific Processing Process)

Figure 6:
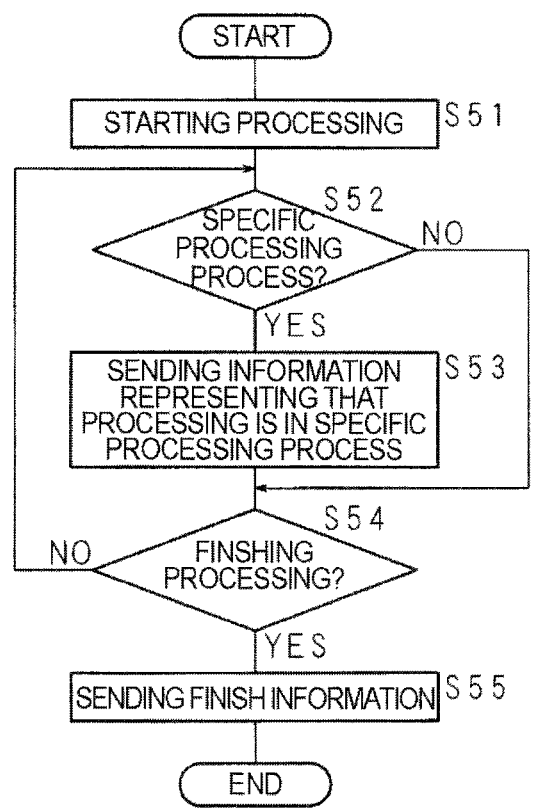
FIG. 6 is a flowchart illustrating an example of an information sending sequence from a processing apparatus.

FIG. 6 is a flowchart illustrating an example of an information transmission sequence in a processing apparatus 2. The processing apparatus 2 starts a processing for a workpiece (step S51). Then, the processing apparatus 2 determines whether the processing for the workpiece is in a set specific processing process or not (step S52). When it is determined that the workpiece is in the specific processing process (step S52: YES), the processing apparatus 2 sends information representing that the workpiece is in the specific processing process to the production efficiency improving apparatus 1 (step S53). This information is information for reporting that the processing sequence in the processing apparatus 2 has passed the specific processing process. When the processing of the step S53 is finished or when it is determined that the workpiece is not in the specific processing process (step S52: NO), the processing apparatus 2 determines whether the processing for the workpiece has been finished or not (step S54). When it is determined that the processing has not been finished (step S54: NO), the processing apparatus 2 returns the processing to step S52 and continuously performs the processing for the workpiece. When it is determined that the processing has been finished (step S54: YES), the processing apparatus 2 sends processing finish information to the production execution control apparatus 4 (step S55) and finishes the processing.

For example, the set specific processing process is set as a process in which the number of non-processed workpieces accommodated in each FOUP becomes less than a predetermined number for each FOUP disposed on the first and the second load ports 21a, 21b, and, at the timing when the number of non-processed workpieces accommodated in each FOUP becomes less than the predetermined number for each FOUP disposed on the first and the second load ports 21a, 21b, the processing apparatus 2 reports it to the production efficiency improving apparatus 1.

Also, for example, when the processing apparatus 2 is a batch-type heat treatment device configured to process a plurality of workpieces simultaneously, the set specific processing process refers to a processing step which is set as a predetermined processing step, for example, a step which is located prior to the final step of the processing sequence which is being executed, by three steps.

(Information 2: Predetermined Processing Finish Time)

Figure 7:
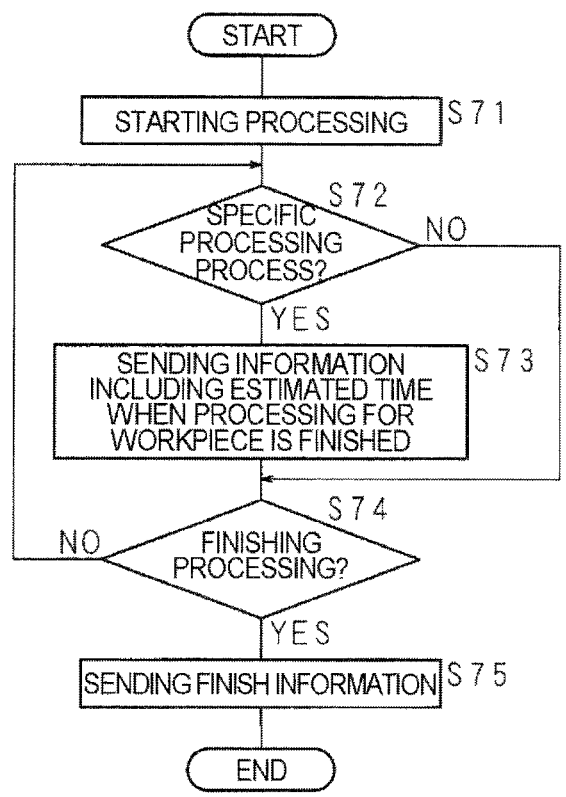
FIG. 7 is a flowchart illustrating another example of an information sending sequence from a processing apparatus.

FIG. 7 is a flowchart illustrating another example of the information transmission sequence in a processing apparatus 2. The processing apparatus 2 starts a processing for a workpiece (step S71). Then, the processing apparatus 2 determines whether the processing for the workpiece is in a specific processing process or not (step S72). When it is determined that the workpiece is in the specific processing process (step S72: YES), the processing apparatus 2 sends the information including the predetermined processing finish time when the processing for the workpiece is finished to the production efficiency improving apparatus 1 (step S73). The predetermined processing finish time is an example and may be replaced by information representing the timing of finishing the processing. The predetermined processing finish time sent from the processing apparatuses 2 may be calculated with an operation equation determined based on the information of a recipe and may be calculated statistically from the past processing finish times. When the processing of step S73 is finished or it is determined that no workpiece is in the specific processing process (step S72: NO), the processing apparatus 2 determines whether the processing for the workpiece has been finished or not (step S74). When it is determined that the processing has not been finished (step S74: NO), the processing apparatus 2 returns the processing to step S72 and continues the processing for the workpiece. When it is determined that the processing has been finished (step S74: YES), the processing apparatus 2 sends the processing finish information to the production execution control apparatus 4 (step S75) and finishes the processing.

The production efficiency improving apparatus 1 estimates the processing finish time based on the information sent from the processing apparatuses 2 according to the above-described processing sequence. Alternatively, the time represented in the information sent from the processing apparatuses 2 may be taken as the processing finish time as it is.

(Information 3: Specific State)

Figure 8:
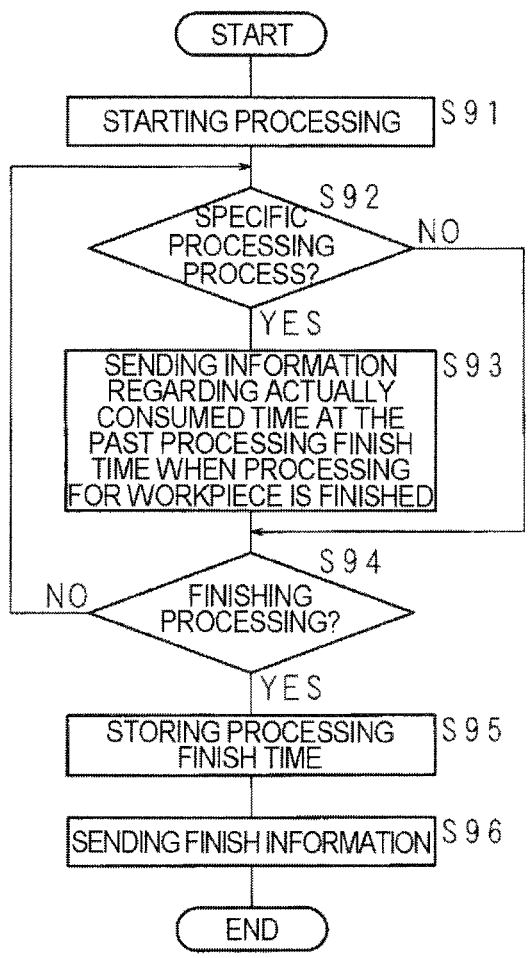
FIG. 8 is a flowchart illustrating another example of an information sending sequence from a processing apparatus.

FIG. 8 is a flowchart illustrating another example of the information transmission sequence in a processing apparatus 2. The processing apparatus 2 starts a processing for a workpiece (step S91). Then, the processing apparatus 2 determines whether the processing for the workpiece is in a specific processing process or not (step S92). When it is determined that the workpiece is in the specific processing process (step S92: YES), the processing apparatus 2 sends information regarding an actually consumed time at the past processing finish time when the processing for the workpiece is finished to the production efficiency improving apparatus 1 (step S93). The information regarding the actually consumed time refers to information related to, for example, an actually consumed time required for the past processing in the processing apparatus 2 or an actually consumed time when the processing was finished. When the processing of step S93 is finished or it is determined the workpiece is not in the specific processing process (step S92: NO), the processing apparatus 2 determines whether the processing for the workpiece has been finished or not (step S94). When it is determined that the processing has not been finished (step S94: NO), the processing apparatus 2 returns the processing to step S92 and continues the processing for the workpiece. When it is determined that the processing has been finished (step S94: YES), the processing apparatus 2 stores the processing finish time (step S95), sends the processing finish information to the production execution control apparatus 4 (step S96), and finishes the processing.

The production efficiency improving apparatus 1 estimates the processing finish time by processing the information sent from the processing apparatus 2 according to the above-described processing sequence statistically. The processing finish time is estimated based on, for example, a mean value, dispersion, a maximum value, a minimum value, a median value, and the mode of lengths of time required for processing.

Also, the information regarding the past processing finish time may be properly processed in the processing apparatus 2 and sent to the production efficiency improving apparatus 1. Raw data of the processing finish time stored in the processing apparatus 2 may be sent to the production efficiency improving apparatus 1.

(Information 4: Specific State of Processing Apparatus)

Figure 9:
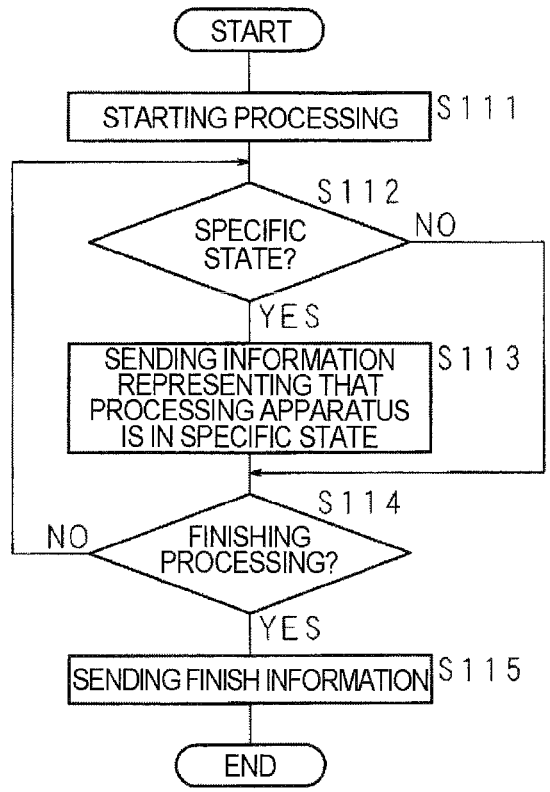
FIG. 9 is a flowchart illustrating another example of an information sending sequence from a processing apparatus.

FIG. 9 is a flowchart illustrating another example of the information sending sequence in a processing apparatus 2.

The process module 25a of the processing apparatus 2 starts a processing which does not use a workpiece, for example, a dry cleaning processing for maintenance (step S111). Then, the processing apparatus 2 determines whether the processing apparatus 2 is in a specific state or not (step S112). When it is determined that the processing apparatus 2 is in the specific state (step S112: YES), the processing apparatuses 2 sends information representing that the processing apparatus 2 is in the specific state to the production efficiency improving apparatus 1 (step S113). When the processing of step S113 is finished or it is determined that the processing apparatus 2 is not in the specific state (step S112: NO), the processing apparatus 2 determines whether the processing has been finished or not (step S114). When it is determined that the processing has not been finished (step S114: NO), the processing apparatus 2 returns the processing to step S112 and continues the processing. When it is determined that the processing has been finished (step S114: YES), the processing apparatus 2 sends the finish information to the production execution control apparatus 4 (step S115) and finishes the processing. The production efficiency improving apparatus 1 estimates the processing finish time based on the information representing that the processing apparatus 2 is in the specific state and is ready to move a workpiece to be processed next toward the processing apparatus 2 according to the estimated time. When instruction information of moving the workpiece to be processed next to the processing apparatus 2 according to the estimated processing finish time is sent to the conveyance control apparatus 31 and the workpiece is delivered to the processing apparatus 2, it is possible to shorten the time until the processing for the workpiece may be started after the processing which does not use the workpiece in the process module 25a of the processing apparatus 2. Therefore, the degree of contribution of the process module 25a in production may be increased and thus, the processing efficiency may be enhanced.

Thus, it is more desirable to set a timing, which is ahead the timing of finishing the processing which does not use the workpieces by the time period of the obtained statistical value, as the specific state, according to a statistical value of lengths of time required for delivering workpieces to be processed next to the processing apparatus 2.

(Information Acquisition Method 1: Request)

Figure 10:
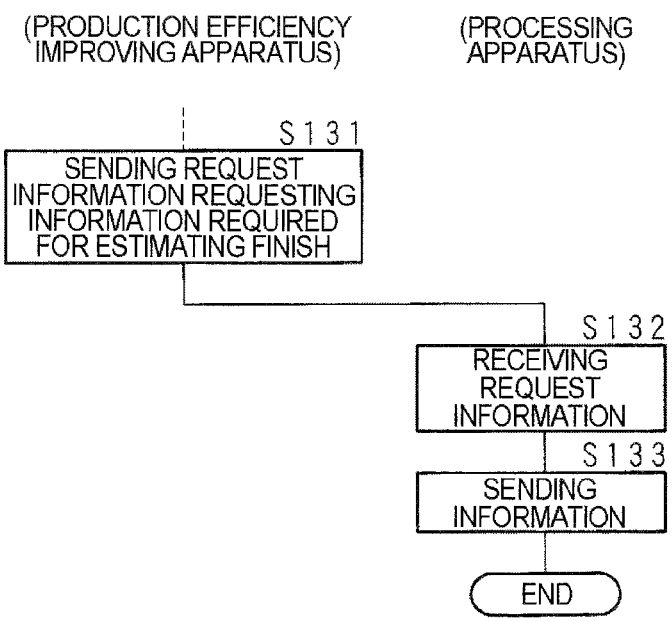
FIG. 10 is a flowchart illustrating another example of an information sending sequence from a processing apparatus.

FIG. 10 is a flowchart illustrating another example of the information transmission sequence in a processing apparatus 2. The control unit 11 of the production efficiency improving apparatus 1 sends request information which requests for information required for estimating the processing finish for a workpiece to the processing apparatus 2 (step S131).

The processing apparatus 2 receives the request information sent from the production efficiency improving apparatus 1 (step S132). Then, the processing apparatus 2 sends information required for estimating the processing finish such as, for example, a processing process for a workpiece, the state of the processing apparatus 2, and a processing recipe for the workpiece when the request is received to the production efficiency improving apparatus 1 (step S133) and finishes the processing.

(Information Acquisition Method 2: Timing Setting and Change)

Figure 11:
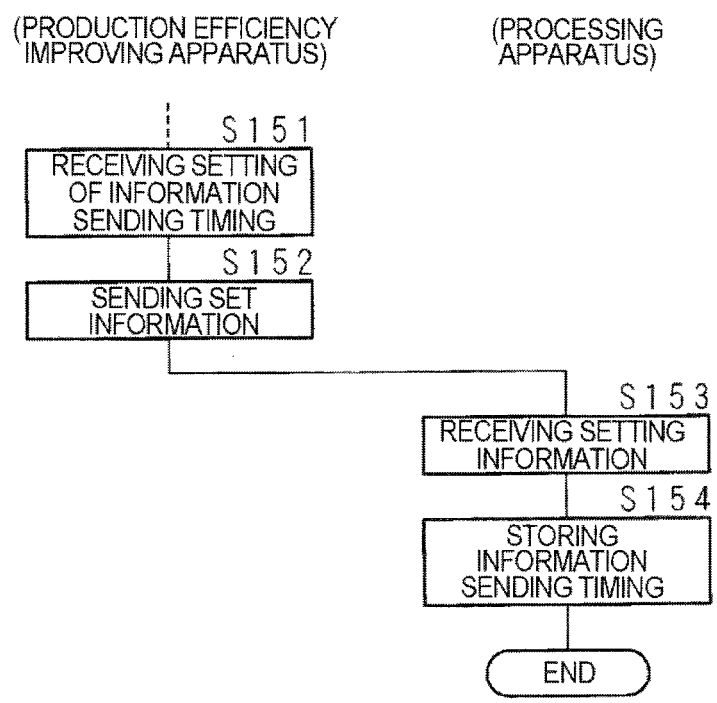
FIG. 11 is a flowchart regarding setting of a sending timing of information required for estimating a processing finish in a processing apparatus.

FIG. 11 is a flowchart regarding setting of a transmission timing of information required for estimating the processing finish in a processing apparatus 2. The control unit 11 of the production efficiency improving apparatus 1 receives the setting of transmission timing of the information required for estimating the processing to the production efficiency improving apparatus 1 via an input device which is not illustrated (step S151). Then, the control unit 11 sends setting information which requests for setting the transmission timing of the information to the processing apparatus 2 (step S152).

The processing apparatus 2 receives the setting information sent from the production efficiency improving apparatus 1 (step S153). Then, the processing apparatus 2 sets the transmission timing of the information according to the contents of the setting information received in step S153 (step S154). When the set timing has been already set, it is changed to the new set timing. Thereafter, the processing apparatus 2 sends the information required for estimating the processing finish to the production efficiency improving apparatus 1 at the timing set in step S154.

Although an example in which the transmission timing of the information is manually set has been described, it may be configured such that the setting is changed automatically. For example, when the delay frequency of movement instructions for the conveyance apparatuses 32 is not less than a threshold, the setting may be changed such that the transmission timing of the information becomes early. When the delay frequency of the speculative movement instruction for the conveyance apparatuses 32 is reduced, the production efficiency may be further improved. The speculative movement instruction refers to an instruction which causes the movement of a conveyance apparatus 32 to be started such that the conveyance apparatus 32 may arrive at the processing apparatus 2 which is the origin of transmission of the information at the timing corresponding to the estimated processing finish time. On the contrary, when the length of time until the movement of a conveyance apparatus 32 is instructed after the information is sent from the processing apparatus 2 is not less than a predetermined length of time, the setting is changed such that the transmission timing of the information becomes later. When the transmission timing of information from the processing apparatuses 2 is optimized, the precision of the speculative movement instruction may be improved and thus, the production efficiency may be improved.

Referring back to FIG. 4, the processing after step S12 will be described.

The control unit 11 of the production efficiency improving apparatus 1 receives the information sent from a processing apparatus 2 via the first communication unit 14 (step S12) and estimates the processing finish time when the processing apparatus 2 which is the origin of transmission of the information finishes the processing based on the received information (step S13). The processing finish time is an estimated time when, for example, the processing of the processing apparatuses 2 is finished, then the processed workpiece is recovered to a FOUP disposed on a load port, and then the FOUP may be carried out.

Subsequently, the control unit 11 generates speculative instruction information which causes the movement of the conveyance apparatuses 32 to be started to the processing apparatus 2 which is the origin of transmission of the information at the timing corresponding to the processing finish time based on the estimated processing finish time (step S14) and sends the generated speculative instruction information to the conveyance control apparatus 31 via the second communication unit 15 (step S15). The speculative instruction information is an example of the control information regarding the control of the conveyance apparatuses 32.

Also, at this time, the production efficiency improving apparatus 1 may be configured such that it may send the information for giving an instruction to prepare a workpiece to be recovered from a processing apparatus 2 at the predetermined arrival timing a conveyance apparatus 32 to the processing apparatus 2. Upon receiving the information from the production efficiency improving apparatus 1, the processing apparatus 2 performs a preparation processing to transfer the workpiece to the conveyance apparatus 32.

The transmission timing of the speculative command information to cause the movement of the conveyance apparatus 32 to be started is decided based on a predetermined length of time required by the conveyance apparatus 32 for moving to the processing apparatus 2 and the predetermined time when the processing in the processing apparatuses 2 is finished and the processed workpiece may be taken out. For example, the movement of the conveyance apparatus 32 may be instructed such that the conveyance apparatus 32 arrives at the processing apparatus 2 in time for the predetermined time when the workpiece may be taken out from the processing apparatus 2. Also, when a risk of congestion of conveyance apparatuses 32 is low, the conveyance apparatus 32 may be adapted to arrive at the processing apparatus earlier than the predetermined time when the workpiece may be taken out from the processing apparatus 2. On the contrary, when the congestion of conveyance apparatuses 32 is expected, the conveyance apparatus 32 may be adapted to arrive at the processing apparatus 2 later than the predetermined time when the workpiece may be taken out. Other proper timings of the movement instruction will be described in modified examples to be described later.

Also, a predetermined length of time required by a conveyance apparatus 32 for moving to a processing apparatus 2 is calculated in consideration of the distance between the conveyance apparatus 32 and the processing apparatus 2, the speed of the conveyance apparatus 32, the conveyance route, the congested situation, and the other situations. For example, the time required for movement may be recorded and then the predetermined length of time may be statistically calculated based on the recorded time. In addition, the predetermined length of time may be calculated through an internal simulation based on the position, the conveyance route, and the speed of the conveyance apparatus 32. Further, the predetermined length of time may be calculated by simulating respective movement schedules of a plurality of conveyance apparatuses 32 and a complex situation of conveyance routes based on the movement schedules.

Further, the instruction information may be made to include an instruction to move the conveyance apparatus 32 such that the conveyance apparatus 32 enters to a region where a large number of processing apparatuses 2 which finish processings within the predetermined length of time exist as compared to a region where a small number of processing apparatuses 2 which finish processings within the predetermined length of time exist. Since meaningless overpopulation or depopulation of conveyance apparatuses 32 may be suppressed, the conveyance apparatuses 32 may be moved to the processing apparatuses 2 more efficiently.

The conveyance control apparatus 31 receives the speculative instruction information sent from the production efficiency improving apparatus 1 (step S16). Then, the conveyance control apparatus 31 executes an allocation scheduling and a stand-by processing of the conveyance apparatuses 32 based on the received speculative instruction information (step S17) and sends a movement instruction to an empty conveyance apparatus 32 (step S18). The instruction executed in step S18 is an instruction regarding the speculative preparation which is performed prior to a definite control instruction sent from the production execution control apparatus 4. A recover instruction may be sent simultaneously when the movement instruction is sent to the conveyance apparatuses 32 (step S18).

The conveyance apparatuses 32 receive the movement instruction from the conveyance control apparatus 31 (step S19). Then, the empty conveyance apparatus 32 moves closer to a processing apparatus 2 designated according to the received instruction (step S20). That is, a conveyance apparatus 32 for recovering a workpiece processed in a processing apparatus 2 moves to the processing apparatus 2 prior to receiving the instruction from the production execution control apparatus 4.

Also, closer to the designated processing apparatus 2 (hereinafter, referred to as a first processing apparatus 2), a conveyance apparatus 32 loaded with a workpiece, more specifically, the conveyance apparatus 32 loaded with the workpiece to be processed next in the first processing apparatus 2 is moved (step S21). Further, when there is no conveyance apparatus 32 loaded with a workpiece to be processed next in the first processing apparatus 2, an empty conveyance apparatus 32 is moved to another processing apparatus 2 (referred to as a second processing apparatus 2) at the process just before the first processing apparatus 2 in order to take out a workpiece to be recovered from the second processing apparatus 2, or to a stocker (not illustrated) where a workpiece to be processed next in the processing apparatuses 2 is stocked. Then, the empty conveyance apparatus 32 is loaded with a workpiece to be processed next and then, moved to the designated first processing apparatus 2.

When a processing apparatus 2 finishes a processing for a workpiece (step S22), the processing apparatus 2 sends the processing finish information representing that the processing is finished to the production execution control apparatus 4 (step S23).

When the production execution control apparatus 4 receives the processing finish information from the processing apparatus 2 (step S24), the production execution control apparatus 4 sends definite conveyance instruction information to the production efficiency improving apparatus 1 (step S25). The conveyance instruction information is one of the items of the production execution control information.

The control unit 11 of the production efficiency improving apparatus 1 receives the conveyance instruction information sent from the production execution control apparatus 4 via the third communication unit 16 (step S26). Then, the control unit 11 matches the contents of the speculative instruction information generated in step S14 with the conveyance instruction information received in step S26 (step S27) and sends the matched conveyance instruction information to the conveyance control apparatus 31 (step S28).

Hereinafter, a processing of matching the conveyance instruction information with the speculative instruction information will be described. First, an existing sequence performed in the processing apparatuses 2, the production execution control apparatus 4, and the conveyance apparatuses 31 will be described. When a processing in a processing apparatus 2 is finished and thus, a workpiece which may be carried out from the processing apparatus 2 exists, the processing apparatus 2 sends information indicating that, since the processing is finished, the workpiece may be carried out to the production execution control apparatus 4. Upon receiving the information indicating that, since the processing is finished, the workpiece may be carried out, the production execution control apparatus 4 sends conveyance instruction information representing an instruction to recover the workpiece from the processing apparatus 2 to the conveyance control apparatus 31. Upon receiving the conveyance instruction information, the conveyance control apparatus 31 causes a conveyance apparatus 32 to move to the processing apparatus 2 according to the conveyance instruction information and to recover the workpiece.

Even if the production efficiency improving apparatus according to the present exemplary embodiment is adopted, it is not required to largely change the existing sequence. Therefore, the production efficiency improving apparatus 1 may be configured to move a conveyance apparatus 32 such that, based on an estimated processing finish time, the conveyance apparatus 32 arrive at a processing apparatus 2 at the estimated processing finish timing before the processing finish report is sent from the processing apparatus 2 and, even if the conveyance apparatus 32 has arrived at the position corresponding to the processing apparatus 2 which is the destination, to cause the conveyance apparatus 32 to be stopped such that the conveyance apparatus 32 stands by at a position corresponding to the processing apparatus 2 or takes a tour around the position until the recovery instruction of the workpiece is sent from the production execution control apparatus 4 to the conveyance control apparatus 31. With such a configuration, upon receiving the recovery instruction from the production execution control apparatus 4, the conveyance control apparatus 31 causes the workpiece to be recovered from the processing apparatus 2 by the conveyance apparatuses 32 in response to the reception of the recovery instruction.

As described above, the speculative instruction information for instructing a conveyance apparatus 32 to perform speculative conveyance and the conveyance instruction information for instructing the conveyance apparatuses 32 to recover or deliver a workpiece from the processing apparatus 2 are divided and the job of moving and loading the workpiece waits for instruction from the production execution control apparatus 4. In this manner, the existing control sequence of the 4 production execution control apparatus 4 may be matched.

Also, the above-described matching that processes the conveyance instruction information and the speculative instruction information is an example and the present disclosure is not limited thereto. For example, in the above-described example, the conveyance apparatuses 32 wait for instruction from the production execution control apparatus 4 to recover workpieces. However, the matching may be taken in the following manner: when the production efficiency improving apparatus of the present exemplary embodiment is adopted and it is aimed to further improve the production efficiency by allowing the existing sequence to be changed, even before the instruction information is sent from the production execution control apparatus 4, the conveyance apparatuses 32 and the processing apparatuses 2 come into a state in which they may recover workpieces and the recovery of processed workpieces is sequentially performed. When a processing apparatus which is a delivery destination is not designated from the production execution control apparatus, the workpieces may be may be conveyed to and stocked in an adjacent buffer or stocker such that the carry-in of a workpiece to be processed next in the processing apparatus is instructed to be sequentially responded or an instruction regarding the delivery destination where the workpiece is conveyed may be requested to the production execution control apparatus from the production efficiency improving apparatus 1 or the conveyance control apparatus 31 such that the work piece is conveyed to the next processing apparatus or a stocker based on the obtained instruction. Alternatively, a construction may be made such that a conveyance apparatus 32 may recover a workpiece from a processing apparatus 2 before the conveyance instruction information is sent from the production execution control apparatus 4, or an FOUP may be disposed in the processing apparatus 2. In this case, the conveyance control apparatus 31 may send information representing the processing contents of the conveyance apparatus 32 to the production execution control apparatus 4 and the production execution control apparatus 4 may correct the control contents of the following processing apparatus 2 and conveyance apparatus 32 based on the information.

The conveyance control apparatus 31 receives the matched conveyance instruction information which is sent from the production efficiency improving apparatus 1 (step S29). Then, the conveyance control apparatus 31 sends a recovery instruction to recover the workpiece and conveyance instruction to convey the processed workpiece to a different processing apparatus 2 or the stocker (not illustrated) to the conveyance apparatuses 32 (step S30).

When an empty conveyance apparatus 32 receives the recovery instruction and the conveyance instruction sent from the conveyance control apparatus 31 (step S31), the empty conveyance apparatus moves to the designated processing apparatus 2 to recover a workpiece according to the received recovery instruction (step S32). The conveyance apparatus 32 loaded with the recovered workpiece conveys the workpiece to the appointed processing apparatus 2 or the stocker (step S33).

Also, in the above-described processing sequence, an example in which the instruction of the movement of an empty conveyance apparatus is instructed earlier than that of the movement of a conveyance apparatus loaded with a workpiece is illustrated. However, depending on a disposition situation of the conveyance apparatuses 32, the movement of the conveyance apparatus loaded with the workpiece may be started first and the instruction to move the empty conveyance apparatus may be made subsequently. For example, when the empty conveyance apparatus is more closely disposed to the processing apparatus 2 as compared to a conveyance apparatus loaded with a workpiece, the conveyance apparatus loaded with the workpiece needs a time to move. Thus, the movement of the conveyance apparatus loaded with the workpiece may be instructed first.

(Speculative Preparation Failure Follow Processing)

Figure 12:
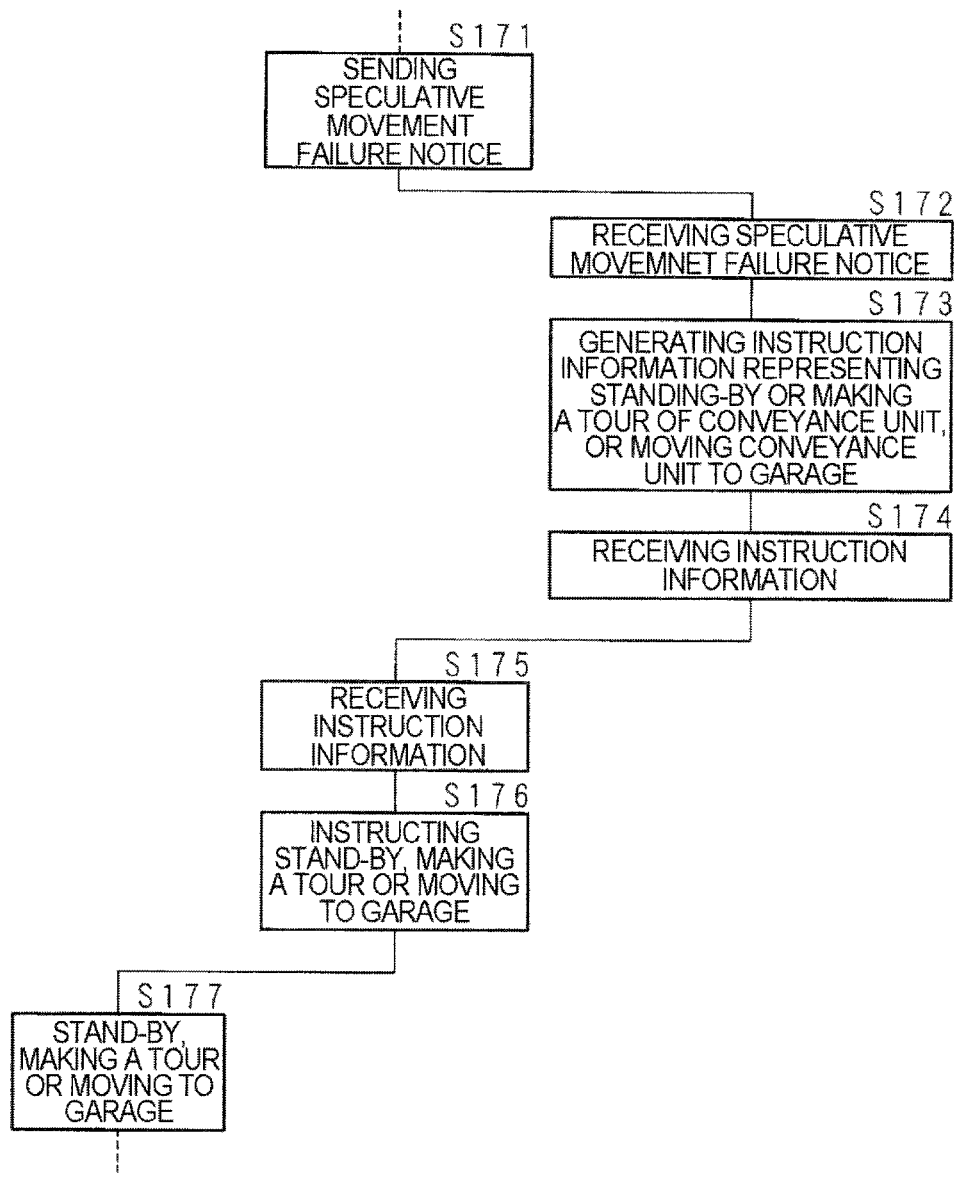
FIG. 12 is a flowchart illustrating a processing sequence when a speculative instruction for conveyance apparatuses is not right.

FIG. 12 is a flowchart illustrating a processing sequence when a speculative instruction for a conveyance apparatus 32 misses the mark. Since the conveyance control apparatus 31 monitors the state of the conveyance apparatus 32 and the production execution control information sent from the production execution control apparatus 4 it may be recognized that the conveyance apparatus 32 have arrived before the processing of a workpiece is finished in the processing apparatus 2. When the conveyance apparatus 32 arrives at the processing apparatus 2 before the processing of the workpiece is finished in the processing apparatuses 2, the conveyance control apparatus 31 sends a speculative movement failure notice to the production efficiency improving apparatus 1 (step S171).

Upon receiving the speculative movement failure notice from the conveyance control apparatus 31 (step S172), the control unit 11 of the production efficiency improving apparatus 1 generates instruction information which instructs the conveyance apparatus 32 to wait, make a tour or move to a garage (step S173). Then, the control unit 11 sends the instruction information generated in step S173 to the conveyance control apparatus 31 (step S174).

Upon receiving the instruction information sent from the production efficiency improving apparatus 1 (step S175), the conveyance control apparatus 31 sends an instruction which instructs the conveyance apparatus 32 which arrived at the processing apparatus 2 wait, to make a tour, or move to a predetermined garage, to the conveyance apparatus 32 (step S176).

The conveyance apparatus 32 stands by around the processing apparatus 2, makes a tour around the processing apparatus 2, or moves to the predetermined garage (step S177).

According to the present exemplary embodiment, the workpieces are conveyed speculatively by estimating the processing finish time for workpieces in the processing apparatuses 2, thereby reducing the conveyance time of the conveyance apparatuses 32. Therefore, the processing efficiency for the workpieces may be improved and thus, the production efficiency may be improved accordingly.

Also, when the operation situations of the processing apparatuses 2 are sent to the production execution control apparatus 4 which is high in processing load even in the present situation so that the production execution control apparatus executes an estimated processing, the processing load of the production execution control apparatus 4 is further increased. Thus, there is a concern that the control for the conveyance apparatuses 32 and the processing apparatuses 2 may be delayed and thus, the production efficiency may deteriorate. However, according to the present exemplary embodiment, since the conveyance apparatuses 32 may be speculatively moved by the control of the production efficiency improving apparatus 1, the production efficiency may be improved while such a problem is avoided.

Further, in the above-described exemplary embodiment, an example which is configured such that the time when the processing of a workpiece in a processing apparatus 2 is finished is estimated and a conveyance apparatus 32 is caused to move closer to the processing apparatus 2 has been described. However, the speculative movement of a conveyance apparatus 32 may be instructed without estimating the processing finish.

For example, an event signal may be output from a processing apparatus 2 at a specific timing so that, when the production efficiency improving apparatus 1 receives the event signal from the processing apparatus 2, the production efficiency improving apparatus 1 may instantly cause a conveyance apparatus 32 to move to the processing apparatus 2. The contents and the output timing of the event signal are not especially limited. Specifically, the event signal may be a signal such as, for example, a signal which is output when a processing for a workpiece enters to a specific process, a signal which is output when a processing apparatus 2 is in a specific state, or a signal including processing finish time information which is output from a processing apparatus 2.

Also, the production efficiency improving apparatus 1 may be configured such that, when the production efficiency improving apparatus 1 receives an event signal output from a processing apparatus 2, the production efficiency improving apparatus 1 causes a conveyance apparatus 32 to move to the processing apparatus 2 after a predetermined length of time after receiving the event signal.

Further, in the present exemplary embodiment, the speculative movement of conveyance apparatuses 32 is adapted to be instructed prior to a control instruction from the production execution control apparatus 4. However, in certain situation, the production efficiency improving apparatus 1 may send an instruction to move a conveyance apparatus 32 to the conveyance control apparatus 31 after a control instruction is sent from the production execution control apparatus 4.

The processing load of the production execution control apparatus 4 is already high in the present situation. Thus, when the processing apparatuses 2 is adapted to send processing situations to the production execution control apparatus 4 to execute an estimation processing, the processing load is further increased and the control for the conveyance apparatuses 32 and the processing apparatuses 2 may be delayed. Thus, the production efficiency may rather deteriorate. However, according to the present exemplary embodiment, since the production efficiency improving apparatus 1 is provided separately from the conveyance control apparatuses 31 and the production execution control apparatus 4, the increase of the processing load of the production execution control apparatus 4 may be suppressed to a minimum.

Also, in the present exemplary embodiment, an example in which the production execution control apparatus 4, conveyance control apparatus 31, and the production efficiency improving apparatus 1 are provided separately has been described. However, the functions of the production efficiency improving apparatus 1 and the conveyance control apparatus 31 may be constructed in one computer.

MODIFIED EXAMPLE 1

Statistical Processing Finish Estimation

Figure 13:
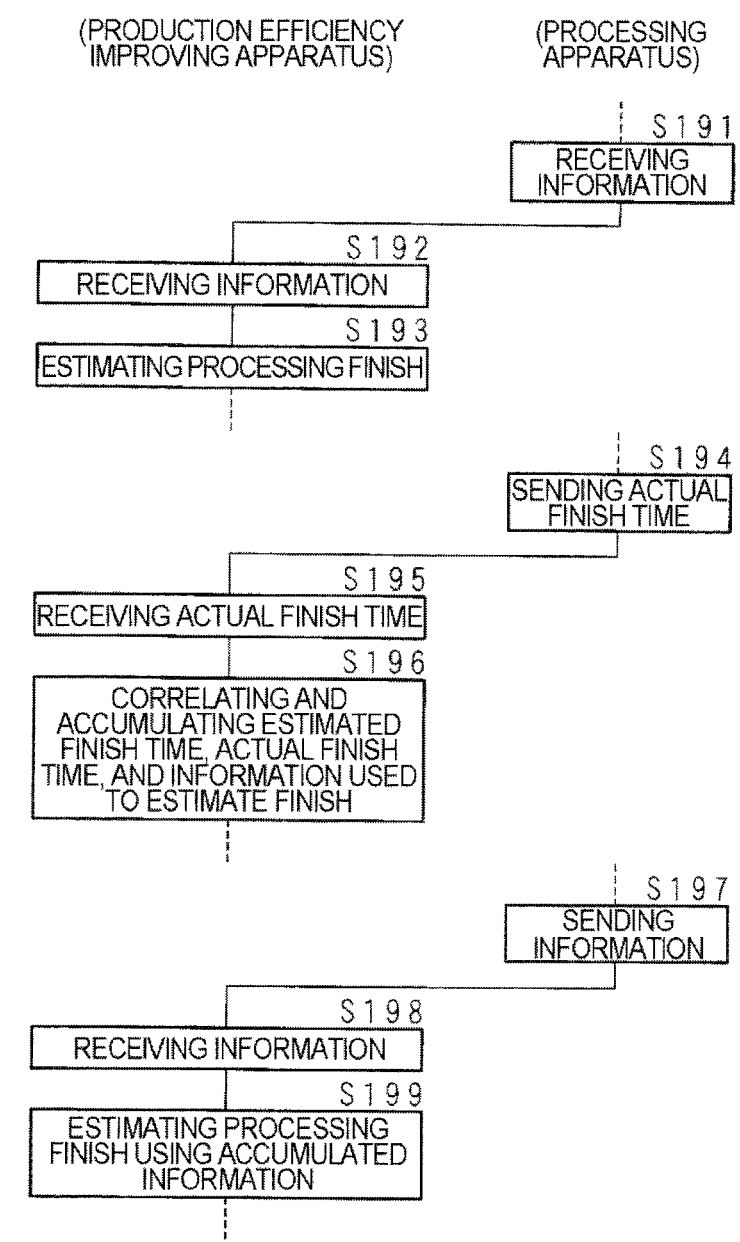
FIG. 13 is a flowchart illustrating a processing sequence regarding production efficiency improvement in a modified example 1.

FIG. 13 is a flowchart illustrating a processing sequence regarding production efficiency improvement in the modified example 1. The processing apparatuses 2 and the control unit 11 of the production efficiency improving apparatus 1 perform sending/receiving of information as in steps S11 and S12 in FIG. 4 (steps S191 and S192) and perform estimation of processing finish for workpieces in the processing apparatuses 2 (step S193).

Then, a processing apparatus 2 which has finished the processing for a workpiece sends the actual finish time when the processing for the workpiece has been actually finished to the production efficiency improving apparatus 1 (step S194). Also, an actual finishing time which is actually needed to finish the processing for a workpiece may be sent instead of the actual finish time and the following processings may be executed using the actual finishing time.

The control unit 11 of the production efficiency improving apparatus 1 receives the actual finish time sent from each processing apparatus 2 (step S195) and correlates and stores an estimated finish time, an actual finish time sent from the processing apparatuses 2, and information used to estimate the processing finish in the internal storage device 13 (step S196). Also, the information corresponding to the processing finish time and the actual finish time includes, for example, an ID specifying the processing apparatus 2 and a recipe. As described above, the production efficiency improving apparatus 1 correlates and stores an estimated finish time, an actual finish time, and information used to estimate the finish whenever the production improving apparatus 1 estimates processing finish in each of the processing apparatuses 2. The information related to processing finish and accumulated in the internal storage device 13 is used to estimate processing finish.

Subsequently, when the information required for estimating the processing finish is sent to the production efficiency improving apparatus 1 again from the processing apparatuses 2 after the above-described information is accumulated in the internal storage device 13 (step S197), the production efficiency improving apparatus 1 receives the information (step S198) and estimates the time when the processing is finished in a processing apparatuses 2 which is and origin of transmission of the above-described information based on the received information and the information accumulated in the internal storage device 13 (step S199). The statistical calculation method of estimating processing finish is not especially limited. For example, the maximum value, the minimum value, the mean value, and the mode of the processing finish time may be calculated based on the information which is stored in the external storage device 13 to calculate the processing finish time. Hereinafter, processings which are the same as the processings after step S14 of FIG. 4 are performed.

The production efficiency improving apparatus 1 of the modified example 1 is configured such that the processing finish time is calculated statistically. Accordingly, the movement of the conveyance apparatuses 32 may be speculatively instructed at the more proper timing, and thus, the production efficiency may be further improved.

MODIFIED EXAMPLE 2

Synchronization

FIGS. 14A to 14D are timing charts illustrating arrival timings of empty conveyance apparatuses and conveyance apparatuses loaded with workpieces according to the modified example 2. FIG. 14A illustrates a probability distribution of arrival timings of conveyance apparatuses loaded with workpieces, FIG. 14B illustrates the probability distribution of arrival timings of empty conveyance apparatuses, and FIGS. 14C and 14D illustrate the timing when the processings for the workpieces disposed on the first and the second load ports 21a, 21b are performed.

Based on a required time required by each of the conveyance apparatuses 32 to move to a processing apparatus 2, a predetermined first time when the processing for a workpiece disposed on the first load port 21a in the processing apparatus 2 is finished and the processed workpiece may be taken out, and a predetermined second time when the processing for a workpiece disposed on the second load port 21b is completely finished, the production efficiency improving apparatus 1 of the modified example 2 instructs the movement of the conveyance apparatuses 32 at the timing when the conveyance apparatuses 32 may arrive between the first time and the second time. For example, the control unit 11 of the production efficiency improving apparatus 1 calculates the probability distribution of the timings when the empty conveyance apparatuses arrive at the processing apparatuses 2 and the probability distribution of the timings when the conveyance apparatuses loaded with a workpiece arrive at the processing apparatuses 2 and instructs each of the conveyance apparatuses 32 of the movement such that each of the probability distributions is distributed between the first time and the second time and the probability distribution regarding the arrival timings of the empty conveyance apparatuses is distributed closer to the first time as compared to the probability distribution regarding the arrival timings of the conveyance apparatuses loaded with workpieces. More properly, the movement of the conveyance apparatuses 32 may be instructed such that respective probability distributions do not overlap, that is, the ratio of the overlapping portion of respective probability distributions is less than a predetermined value. Also, the first time and the second time may be estimated based on, for example, the switching time of the load ports, the number of processed workpieces, and a recipe.

More specifically, as illustrated in FIGS. 14A to 14D, when workpieces disposed on the first load port 21a is being processed, the first time when the processing for the workpieces is finished so that processed workpieces may be taken out is estimated based on the information sent from the processing apparatus 2. Also, after the processing for the workpieces is finished, the processing for the workpieces disposed on the second load port 21b is performed and the control unit 11 estimates the second time when the processing for the workpieces is completely finished using a recipe. Then, the control unit 11 calculates the length of time required by the conveyance apparatuses 32 for moving to the processing apparatuses 2 and instructs the movement of the conveyance apparatuses 32 at the timing when an empty conveyance apparatus and a conveyance apparatus loaded with a workpiece may arrive at the processing apparatus in this order between the first time and the second time.

According to the production efficiency improving apparatus 1 of the modified example 2, the movement of the conveyance apparatuses 32 may be speculatively instructed at the proper timing. Therefore, the production efficiency may be further improved.

MODIFIED EXAMPLE 3

Priority Scheduling

Next, the modified example 3 related to the present disclosure will be described.

In the present modified example 3, the production efficiency improving apparatus 1 estimates the processing finish time to obtain the timing when the carry-out of a workpiece from a processing apparatus 2 becomes possible and the timing when a workpiece to be processed later on does not exist in the processing apparatus 2.

For example, even if the processing is finished in a processing apparatus 2 so that an FOUP accommodating the workpiece which may be carried out form the processing apparatus 2 is on a load port, when an FOUP which is different from the FOUP which may be taken out and accommodates non-processed workpieces is on a separate load port and thus, the non-processed workpiece remain, there is a grace period until the process module reaches a state in which it may not perform the processing for the workpieces. By estimating the processing finish time estimated for each of a plurality of workpieces existing in the processing apparatus 2 or by the FOUP accommodating workpieces, the information related to the conveyance requiring time and sent from the production efficiency improving apparatus 1 to the conveyance control apparatus 31 is information in which a timing when the processing of the workpieces accommodated in an FOUP disposed on at least one of the load ports is finished and the recovery by the conveyance apparatuses becomes possible is taken as the starting point and a timing when the processing of the workpieces accommodated in another FOUP disposed on the other load port is finished to that a workpiece to be processed later on does not exist within the processing apparatus is taken as the finish point and thus, a time width exists.

Accordingly, the conveyance control apparatus 31 may control the conveyance apparatuses 32 such that a conveyance apparatus 32 arrives at the processing apparatus 2 between the starting point and the finish point of the conveyance requiring timing. Since there is a time width as described above, it becomes easy to schedule the movement of the conveyance apparatuses 32 to reduce the congestion of the conveyance apparatuses 32 on the conveyance paths in consideration of the priority of conveyance in the conveyance control apparatus 31. Also, for example, when there is time left until the finish point of the conveyance requiring timing even after a processing for a workpiece is finished in the processing apparatus 2, the processing apparatus 2 reports to the production execution control apparatus 4 that the processing is finished, and the recovery instruction of the workpiece from the processing apparatus 2 is sent from the production execution control apparatus 4 to the conveyance control apparatus 31, the conveyance control apparatus 31 may not respond immediately to the recovery instruction from the production execution control apparatus 4 and delays the movement such that the congestion does not occur, in consideration of the positions and the movement states of the plurality of conveyance apparatuses.

As described above, even if workpieces for which processings are finished to be carried out occur in the processing apparatuses 2, the process module may continue the processing if the processing apparatuses 2 are not in a state in which a non-processed workpiece to be processed does not exist. Therefore, the high production efficiency of the processing apparatuses 2 may be maintained.

MODIFIED EXAMPLE 4

Priority Scheduling

Figure 15:
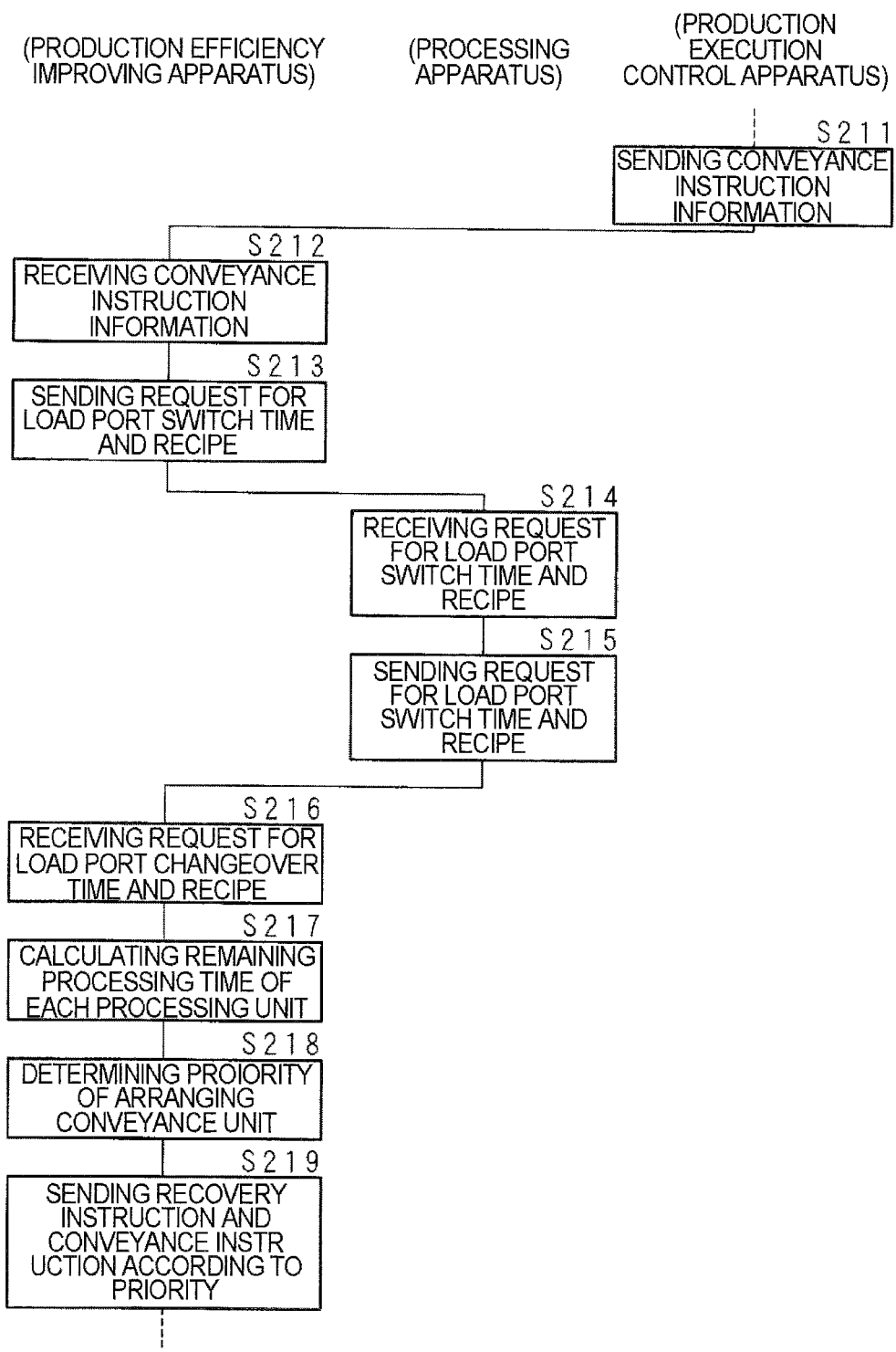
FIG. 15 is a flowchart illustrating a processing sequence regarding production efficiency improvement in a modified example 4.

FIG. 15 is a flowchart illustrating a processing sequence related to production efficiency improvement in the modified example 4. After the conveyance apparatuses 32 are moved speculatively, the conveyance instruction information is sent from the production execution control apparatus 4 (step S211). When the production efficiency improving apparatus 1 receives the conveyance instruction information (step S212), the control unit 11 of the production efficiency improving apparatus 1 requests from the processing apparatuses the switching time of the load ports 21a, 21b and a recipes in which the contents of a processing currently performed for workpieces is described (step S213).

When a processing apparatus 2 receives the request for the switching time of the load ports 21a, 21b and the recipe (step S214), the processing apparatus 2 sends a recipe in which the closest load port switching time and the contents of a processing which is currently performed on a workpiece to the production efficiency improving apparatus 1 (step S215).

The control unit 11 of the production efficiency improving apparatus 1 receives the switching time of the load ports and the recipe sent from the processing apparatus 2 (step S216). Then, the control unit 11 calculates a length of time until the currently performed processing is finished (hereinafter, referred to as a remaining processing time) based on the present time, the switching time of the load ports, and the recipe (step S217). Then, when there are a plurality of processing apparatuses 2 which require the conveyance of workpieces, the control unit 11 determines the priority of the processing apparatuses 2 to allocate a conveyance apparatus 32 (step S218). The priority is determined such that the priority becomes higher for a shorter remaining processing time.

Then, the control unit 11 sends recovery instruction and conveyance instruction information according to the priority to the conveyance control apparatus 31 (step S219).

When scheduling the movement of the conveyance apparatuses 32 as described above, in some cases, considering a situation in which there no workpiece remains in other processing apparatuses 2 as well, a conveyance apparatus 32 may be caused to move first to a processing apparatus 2 in which standby of arrival of a workpiece is likely to occur rather than instructing the movement of conveyance apparatus 32 such that the conveyance apparatus 32 arrives at a processing apparatus 2 in which the processing is finished just after the processing is finished in the processing apparatuses 2.

According to the production efficiency improving apparatus 1 of the modified example 4, since the production efficiency improving apparatus is configured such that the priority of the processing apparatuses 2 which require the arrangement of a conveyance apparatus 32 is determined and the conveyance apparatus 32 is moved first, the production efficiency may be further improved.

MODIFIED EXAMPLE 5

Example of Connection of Production Execution Control Apparatus

Figure 16:
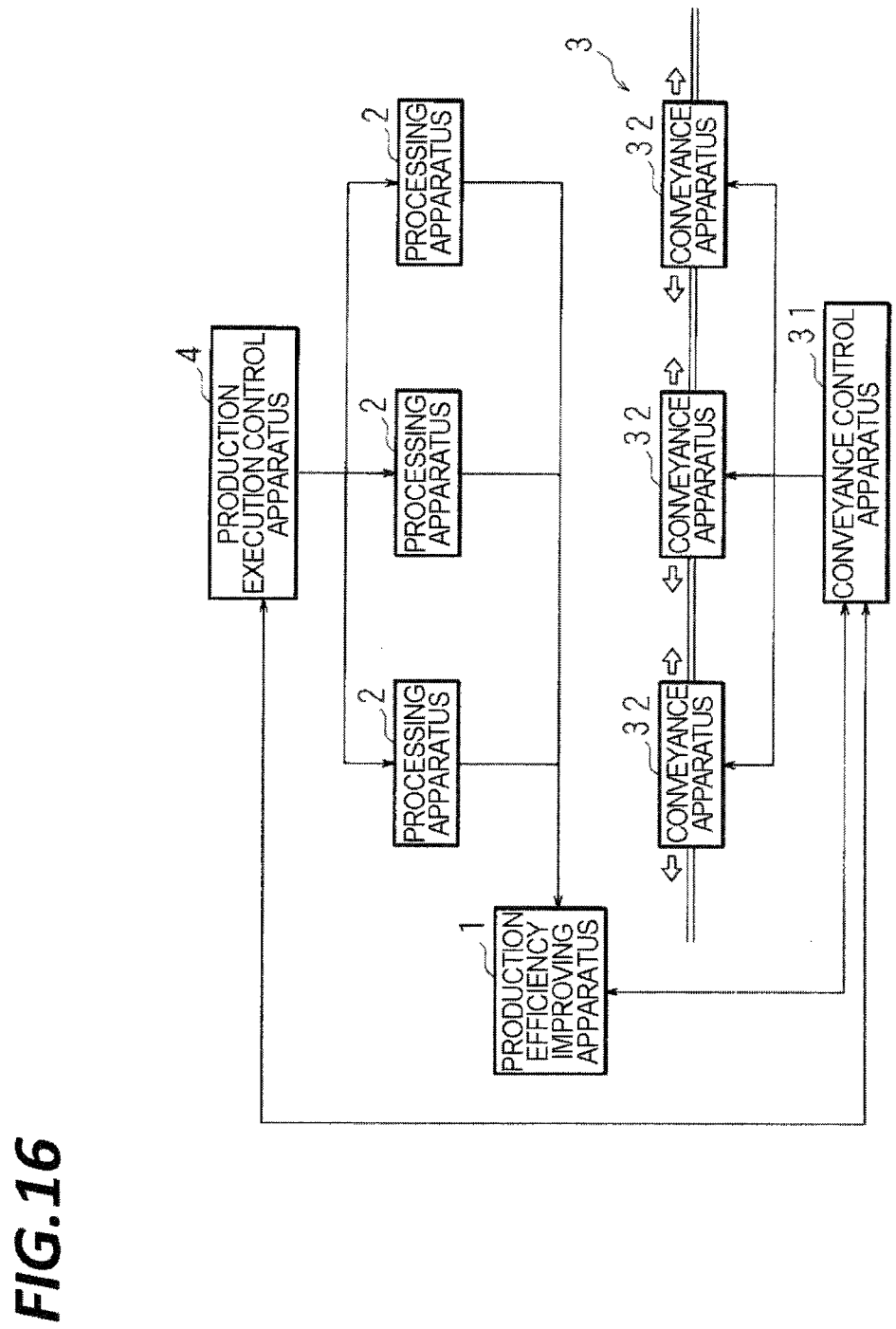
FIG. 16 is a block diagram illustrating a configuration example of a production processing system regarding a modified example 5.

FIG. 16 is a block diagram illustrating a configuration example of the production processing system according to the modified example 5. In the above-described exemplary embodiment, an example in which the production efficiency improving apparatus 1 includes the first to the third communication units 14, 15, 16 which communicate information with the processing apparatuses 2, the conveyance control apparatus 31, and the production execution control apparatus 4 has been described. However, the production efficiency improving apparatus 1 may be configured such that the production efficiency improving apparatus indirectly receives information from the production execution control apparatus 4. For example, the production efficiency improving apparatus 1 may be configured such that the production efficiency improving apparatus 1 receives information sent from the production execution control apparatus 4 via the conveyance control apparatus 31.

According to the production efficiency improving apparatus 1 of the modified example 5, since an interface which sends/receives information to/from the production execution apparatus 4 is unnecessary, a communication system may be constructed with low costs.

MODIFIED EXAMPLE 6

Diversion of Communication Line of Conveyance System 3

Figure 17:
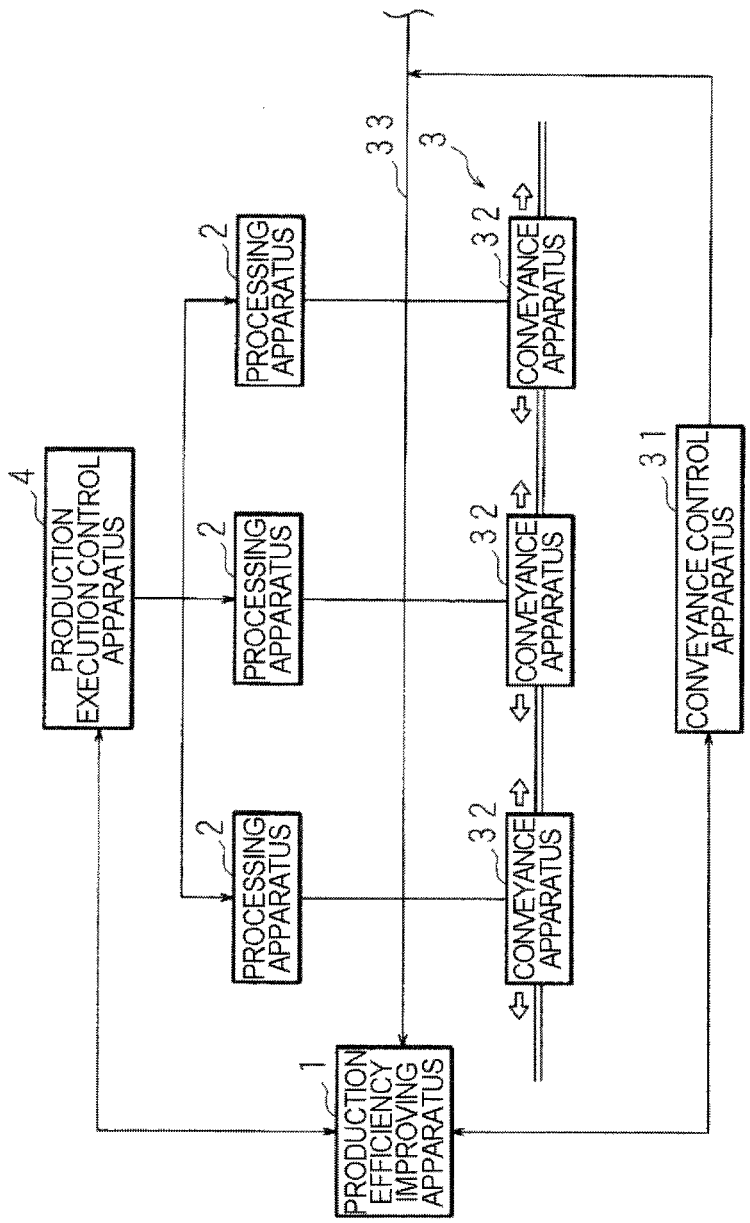
FIG. 17 is a block diagram illustrating a configuration example of a production processing system regarding a modified example 6.

FIG. 17 is a block diagram illustrating a configuration example of the production processing system according to the modified example 6. In the above-described exemplary embodiment, an example in which the production efficiency improving apparatus 1 includes a dedicated line to communicate with the processing apparatuses 2 has been described. However, the production efficiency improving apparatus is not limited thereto and the production efficiency improving apparatus 1 of modified example 6 is configured such that a communication track 33 which sends/receives information to/from the conveyance control apparatus 31 and the conveyance apparatuses 32 is diverted to receive information sent from the processing apparatuses 2. The communication track 33 is laid along the conveyance path of the conveyance apparatuses 32 which configure, for example, the conveyance system 3.

Also, the production efficiency improving apparatus 1 may be configured such that an access point (station) which connects a communication track with the processing apparatuses 2 via the communication track 33 is disposed in the vicinity of a stop point where the conveyance apparatuses 32, which are included in the conveyance system 3 and configured to convey workpieces, deliver the workpieces to the processing apparatuses 2.

According to the production efficiency improving apparatus 1 of the modified example 6, since a dedicated line which sends/receives information to/from the processing apparatuses 2 is unnecessary, the communication system may be constructed with low costs.

MODIFIED EXAMPLE 7

Figure 18:
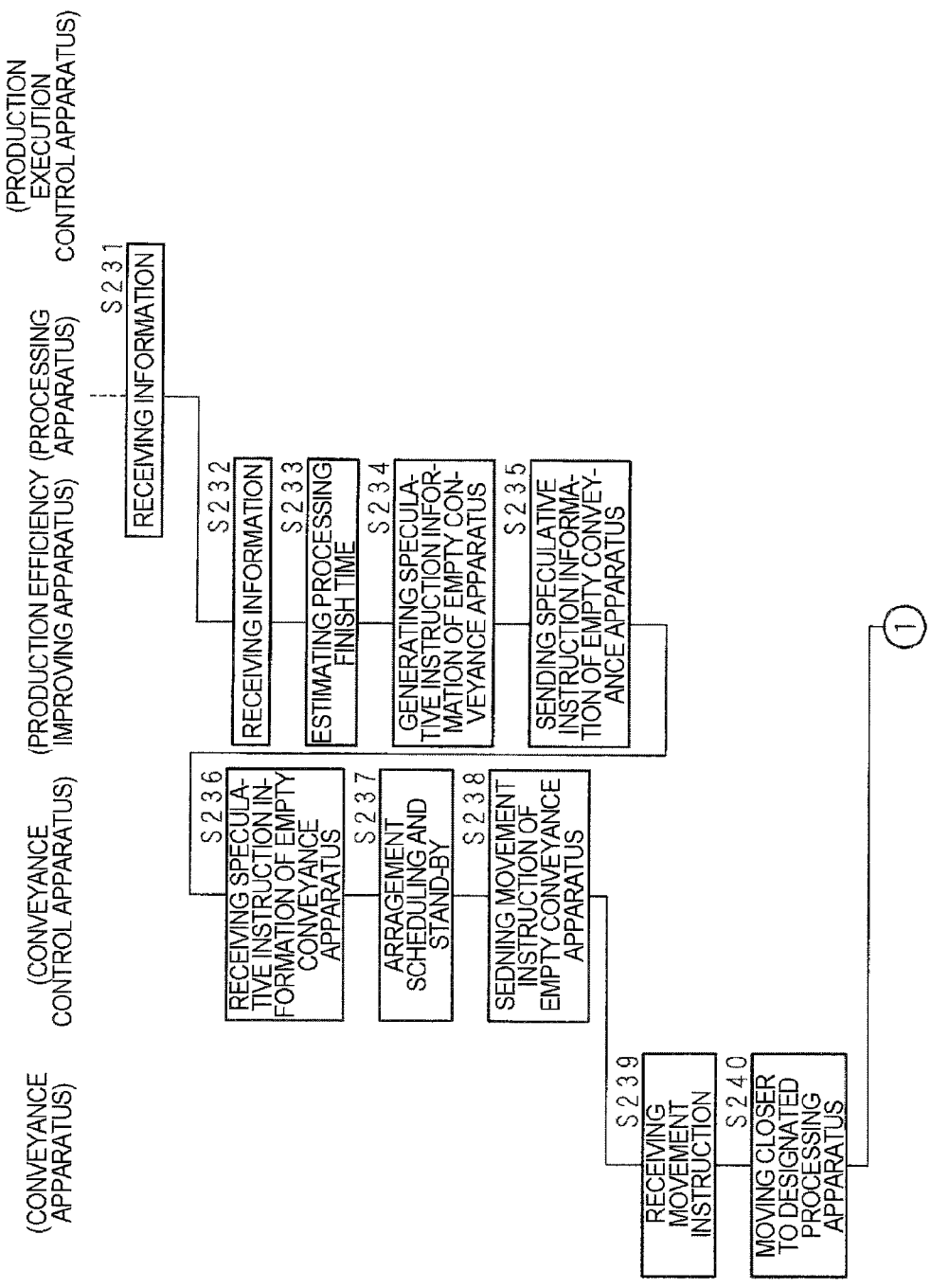
FIG. 18 is a flowchart illustrating a processing sequence regarding production efficiency improvement in a modified example 7.
Figure 19:
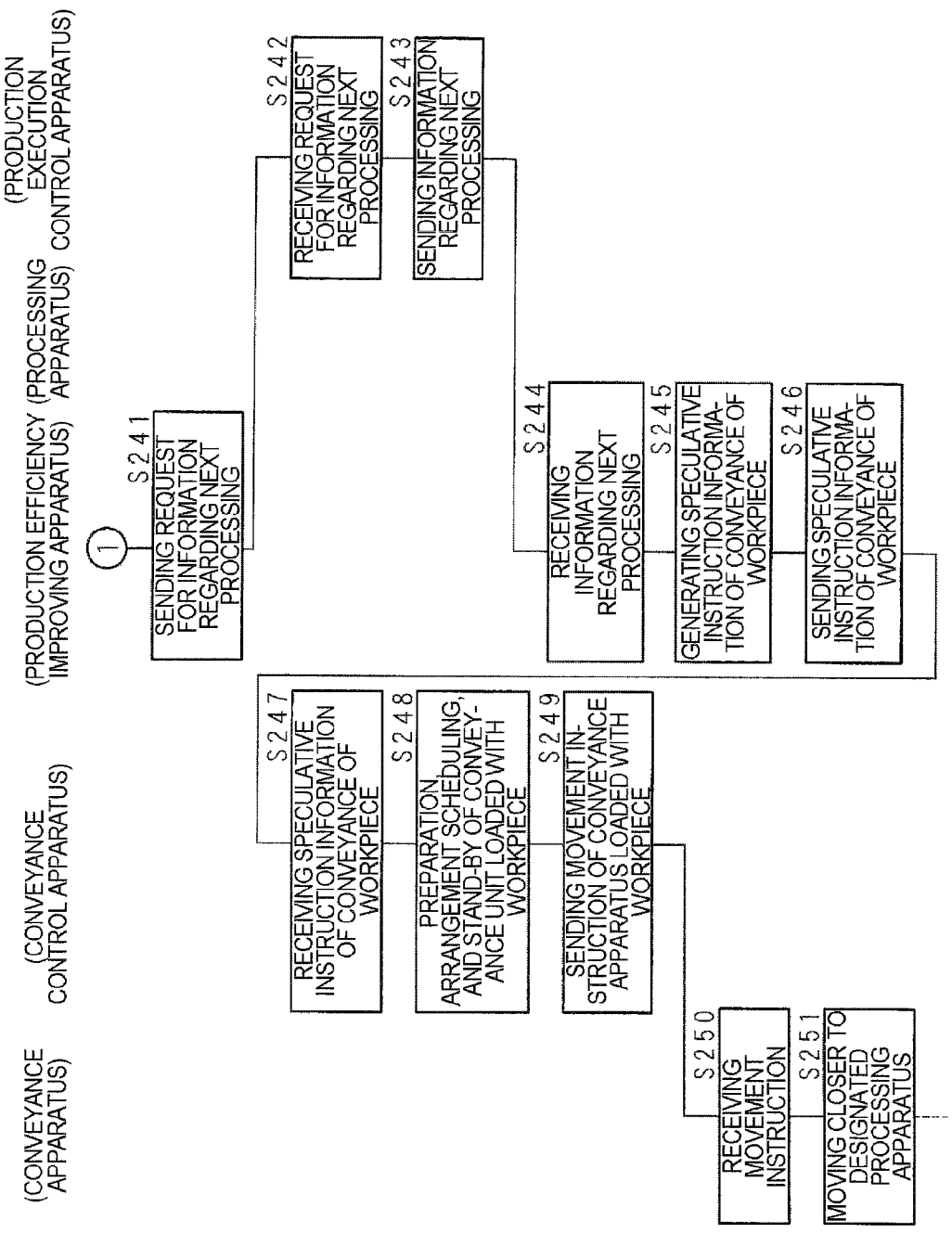
FIG. 19 is a flowchart illustrating the processing sequence regarding production efficiency improvement in the modified example 7.

Movement Instruction Processing of Conveyance Apparatus Loaded with Workpiece FIGS. 18 and 19 are flowcharts illustrating processing sequences related to production efficiency improvement in the modified example 7. The production efficiency improving apparatus 1 of the modified example 7 instructs more accurate speculative movement of the conveyance apparatuses loaded with workpieces using information from the production execution control apparatus 4.

A processing apparatus 2 which is performing a processing for a workpiece sends information required for estimating the time when the processing for the workpiece is finished to the production efficiency improving apparatus 1 (step S231).

The control unit 11 of the production efficiency improving apparatus 1 receives the information sent from the processing apparatus 2 via the first communication unit 14 (step S232) and estimates the processing finish time when the processing apparatus 2 which is the origin of transmission of the information finishes the processing based on the received information (step S233).

Subsequently, the control unit 11 generates speculative instruction information of empty conveyance apparatuses based on the estimated processing finish time (step S234) and sends the generated speculative instruction information of the empty conveyance apparatuses to the conveyance control apparatus 31 via the second communication unit 15 (step S235).

The conveyance control apparatus 31 receives the speculative instruction information of the empty conveyance apparatuses sent from the production efficiency improving apparatus 1 (step S236). Then, the conveyance control apparatus 31 instructs the allocation and movement of conveyance apparatuses 32, that is, the allocation scheduling and standby of the conveyance apparatuses 32 (step S237) and sends the movement instruction of the empty conveyance apparatuses (step S238).

The conveyance apparatuses 32 receive the instruction from the conveyance control apparatus 31 (step S239). Then, a conveyance apparatus 32 which receives the instruction moves closer to a designated processing apparatus 2 according to the received instruction (step S240). That is, the conveyance apparatus 32 that recovers workpieces processed in the processing apparatus 2 moves to the processing apparatuses 2 prior to the instruction from the production execution control apparatus 4.

Subsequently, the control unit 11 requests from the production execution control apparatus 4 information regarding the next processing such as, for example, a lot number of workpieces to be processed next in the processing apparatus 2 which is the origin of transmission of the information (step S241).

When the production execution control apparatus 4 receives the request for the information regarding the next processing from the production efficiency improving apparatus 1 (step S242), the production execution control apparatus 4 sends workpiece designation information regarding the next processing or information for specifying a workpiece regarding the next processing to the production efficiency improving apparatus 1 (step S243).

The control unit 11 of the production efficiency improving apparatus 1 receives the information sent from the production execution control apparatus 4 (step S244), generates speculative instruction information of workpiece conveyance based on the information (step S245), and then sends the generated speculative instruction information of workpiece conveyance to the conveyance control apparatus 31 via the second communication unit 15 (step S246).

The conveyance control apparatus 31 receives the speculative instruction information of the workpiece conveyance sent from the production efficiency improving apparatus 1 (step S247). Then, the conveyance control apparatus 31 performs the allocation scheduling and standby processing of the conveyance apparatuses 32 by specifying a conveyance apparatus 32 loaded with the designated workpieces based on the received speculative instruction information (step S248) and sends the movement instruction (step S249). The instruction rendered in step S248 is an instruction related to speculative preparation which is performed prior to a definite control instruction sent from the production execution control apparatus 4 as will be described later. Also, for example, when the workpiece designated in step S248 is not loaded in the conveyance apparatuses 32 and stocked in, for example, a stocker, the conveyance control apparatus 31 may causes the present stock place of the designated workpieces to be specified, the conveyance apparatus 32 for loading the workpieces to be allocated, the loading and movement of the workpiece to be scheduled, and the standby processing of the conveyance apparatus 32 to be executed.

A conveyance apparatus 32 receives the instruction from the conveyance control apparatus 31 (step S250). Then, the conveyance apparatus 32 is loaded with workpieces related to the next processing of a processing apparatus 2 and moves closer to the designated processing apparatus 2 according to the received instruction (step S251). That is, the conveyance apparatus 32 which conveys the workpieces to be processed next in the processing apparatus 2 moves to the processing apparatus 2 prior to the instruction from the production execution control apparatus 4.

Also, various modified examples described in the processing of speculative movement instruction of empty conveyance apparatuses may be employed to the speculative movement instruction of conveyance apparatuses loaded with workpieces.

According to the production efficiency improving apparatus 1 of modified example 7, since the speculative movement of conveyance apparatuses loaded with workpieces may be accurately instructed, the production efficiency may be improved.

In the above-described exemplary embodiment, an example in which the 4 production execution control apparatus 4, the conveyance control apparatus 31, and the production efficiency improving apparatus 1 are separately provided has been described. However, the production efficiency improving apparatus 1 may also be provided with the functions of the conveyance control apparatus 31.

The exemplary embodiments disclosed are illustrative in all aspects and should not be considered to be limiting. The scope of the present disclosure is defined by the claims rather than by the foregoing descriptions, and intended to cover all the changes within the equivalent meaning and scope of the claims.

In the exemplary embodiments disclosed herein, an example in which workpieces are conveyed using an FOUP which is a closed container configured to accommodate workpieces and provided with a cover which may be opened/closed at a lateral side has been described. However, an SMIF pod having a cover on the bottom side may be employed and an open cassette which is an uncovered open type accommodating container may also be employed. Also, the number of workpieces accommodated in an accommodating container may be one and the workpieces may be moved without being accommodated in a container.

Description Of Symbols

1: production efficiency improving apparatus
2: processing apparatus
3: conveyance apparatus
4: production execution control apparatus
5: record medium
5a: computer program
11: control unit
12: external storage device
13: internal storage device
14: first communication unit
15: second communication unit
16: third communication unit
17: clock unit
21a: first load port
21b: second load port
22: load module
23a, 23b: load lock module
24: transfer module
25a, 25b, 25c, 25d: process module
31: conveyance control apparatus
32: conveyance apparatus

What is claimed:

1. A production efficiency improving apparatus in a production processing system including a production execution control apparatus, a plurality of processing apparatuses, and a conveyance system having a plurality of conveyance apparatuses and a conveyance control apparatus configured to control the plurality of conveyance apparatuses, comprising:
a first communication unit configured to communicate information with the plurality of processing apparatuses each of which is configured to process one or more workpieces;
a second communication unit configured to communicate control information regarding a control of each of the plurality of conveyance apparatuses with the conveyance system, each of the conveyance apparatuses being configured to convey one or more workpieces to one or more of the plurality of processing apparatuses;
a conveyance time estimation unit configured to estimate, based on the information communicated by the first communication unit, a conveyance time when a processing apparatus of the plurality of processing apparatuses requires the conveyance of a workpiece; and
a generation unit configured to generate control information for the conveyance system such that one or more of the plurality of conveyance apparatuses arrive at one or more of the plurality of processing apparatuses at the conveyance time estimated by the conveyance time estimation unit,
wherein the production efficiency improving apparatus is separately provided from the conveyance control apparatus and the production execution control apparatus.

2. The production efficiency improving apparatus of claim 1, wherein the control information includes an instruction to move a conveyance apparatus which is not loaded with a workpiece to a processing apparatus of the plurality of processing apparatuses.

3. The production efficiency improving apparatus of claim 1, wherein the control information includes an instruction to move a conveyance apparatus which is loaded with a workpiece to a processing apparatus of the plurality of processing apparatuses.

4. The production efficiency improving apparatus of claim 1, wherein
the control information includes an instruction to move the plurality of conveyance apparatuses such that more conveyance apparatuses are distributed in a region where a large number of processing apparatuses which finish the processing for workpieces during a predetermined period are present as opposed to a region where a small number of processing apparatuses which finish the processing for workpieces during the period are present.

5. The production efficiency improving apparatus of claim 2, wherein the generation unit is configured to generate control information which includes:
an instruction to make the conveyance apparatus stand by when the conveyance apparatus arrive at the processing apparatus before the processing of the workpiece is finished,
an instruction to make the conveyance apparatus tour around the processing apparatus, and
an instruction to move the conveyance apparatus to a predetermined position.

6. The production efficiency improving apparatus of claim 2, wherein the control information includes an instruction to move each of the conveyance apparatuses such that a conveyance apparatus which is not loaded with a workpiece arrives at the processing apparatus, and then a conveyance apparatus which is loaded with a workpiece arrives at the processing apparatus.

7. The production efficiency improving apparatus of claim 1, further comprising:
a unit configured to directly or indirectly communicate production execution control information sent from a production execution control apparatus,
wherein the production execution control apparatus controls an operation of the plurality of processing apparatuses and the plurality of conveyance apparatuses, and
the control information sent from the production execution control apparatus and the control information generated by the generation unit are adapted not to contradict each other.

8. The production efficiency improving apparatus of claim 2, further comprising:
a unit configured to predict a required movement time needed for the conveyance apparatus to arrive at the processing apparatus,
wherein the control information includes a movement start time when the movement of the conveyance apparatus is started, and
the movement start time is ahead of the conveyance time by the required movement time.

9. The production efficiency improving apparatus of claim 2, wherein the conveyance time includes:
a time at which the processing in the processing apparatus is finished and the workpiece may be taken out by the conveyance apparatus,
a time at which a non-processed workpiece to be processed in the processing apparatus does not exist, and
a time between the time at which the processing in the processing apparatus is finished and the time at which the non-processed workpiece to be processed in the processing apparatus does not exist.

10. The production efficiency improving apparatus of claim 1, wherein each of the processing apparatuses is configured to communicate information regarding a remaining processing time of a workpiece which is put into the processing apparatus and information regarding a time during which a next workpiece is needed to continue the processing subsequently, and the production efficiency improving apparatus further includes:
- a unit configured to calculate a finish time when the processing of the workpiece put into each of the processing apparatuses is finished and a start time when each of the processing apparatuses needs a next workpiece based on the information communicated with the plurality of processing apparatuses; and
- a unit configured to determine the priority to move the conveyance apparatuses based on the calculated finish time and start time.

11. The production efficiency improving apparatus of claim 1, further comprising:
- a unit configured to communicate an actually consumed result time actually required for processing a workpiece in each of the processing apparatuses or an actual finish time when the processing has been actually finished; and
- a unit configured to correlate and accumulate the estimated finish time, the actually result time or the actual finish time, and the information used to estimate the estimated finish time,
wherein the generation unit is configured to generate the control information using the accumulated information.

12. The production efficiency improving apparatus of claim 1, wherein the information communicated by the first communication unit includes information representing that the processing of a workpiece is in a specific processing process.

13. The production efficiency improving apparatus of claim 1, wherein the information communicated by the first communication unit includes information representing a time required for processing a workpiece in each of the processing apparatuses, and a predetermined time when the processing is finished.

14. The production efficiency improving apparatus of claim 1, wherein the information communicated by the first communication unit includes information represented by each processing apparatus that the processing apparatus is in a specific state.

15. The production efficiency improving apparatus of claim 1, wherein the information communicated by the first communication unit includes information regarding an actually consumed time required for a past processing in the processing apparatus or the actual time when the processing is finished in the processing apparatus.

16. The production efficiency improving apparatus of claim 1, wherein the first communication unit is configured to receive information regarding when the processing of a workpiece in each of the processing apparatuses is in a specific processing process.

17. The production efficiency improving apparatus of claim 1, further comprising:
- a unit configured to request information required for estimating a conveyance time when a processing apparatus requires the conveyance of a workpiece,
wherein the first communication unit configured to receive information sent from the processing apparatuses according to the request.

18. The production efficiency improving apparatus of claim 1, further comprising:
- a unit configured to request a set time for sending information required for estimating a conveyance time when the processing apparatus requires the conveyance of a workpiece from each of the processing apparatuses.

19. A production efficiency improving method using a production efficiency improving apparatus in a production processing system including a production execution control apparatus, a plurality of processing apparatuses, and a conveyance system having a plurality of conveyance apparatuses and a conveyance control apparatus configured to control the plurality of conveyance apparatuses, the method comprising:
- communicating information with the plurality of processing apparatuses each of which is configured to process one or more workpieces;
- communicating control information regarding a control of each of the plurality of conveyance apparatuses with the conveyance system, each of the conveyance apparatuses being configured to convey one or more workpieces to one or more of the plurality of processing apparatuses;
- estimating a carry-out time when a processing apparatus of the plurality of processing apparatuses requires a carry-out of a workpiece processed by the processing apparatus or a carry-in time when the processing apparatus requires a carry-in of a workpiece; and
- generating control information for the conveyance apparatus such that one or more of the plurality of conveyance apparatuses arrive at one or more of the plurality of processing apparatuses at a time corresponding to the estimated carry-out time and carry-in time,
wherein the production efficiency improving apparatus is separately provided from the conveyance control apparatus and the production execution control apparatus.

20. A recording medium storing a computer program which enables a computer in a production processing system including a production efficiency improving apparatus, a production execution control apparatus, a plurality of processing apparatuses, and a conveyance system having a plurality of conveyance apparatuses and a conveyance control apparatus configured to control the plurality of conveyance apparatuses to serve as:
- a first communication unit that communicates information with the plurality of processing apparatuses each of which is configured to process one or more workpieces;
- a second communication unit that communicates control information regarding a control of each of a plurality of conveyance apparatuses with the conveyance system, each of the conveyance apparatuses being configured to convey one or more workpieces to one or more of the plurality of processing apparatuses;
- a unit that estimates, based on the information communicated by the first communication unit, a carry-out time period when a processing apparatus requires a carry-out of the workpiece processed by the processing apparatus or a carry-in time when the processing apparatus requires a carry-in of a workpiece; and
- a unit that generates control information for the conveyance apparatus such that one or more of the plurality of conveyance apparatuses arrive at one or more of the plurality of processing apparatuses at a time corresponding to the estimated carry-out time and carry-in time,
wherein the production efficiency improving apparatus is separately provided from the conveyance control apparatus and the production execution control apparatus.

* * * * *